US011245025B2

(12) United States Patent
Lee et al.

(10) Patent No.: US 11,245,025 B2
(45) Date of Patent: Feb. 8, 2022

(54) GATE LAST VERTICAL TRANSPORT FIELD EFFECT TRANSISTOR

(71) Applicant: International Business Machines Corporation, Armonk, NY (US)

(72) Inventors: Choonghyun Lee, Rensselaer, NY (US); Soon-Cheon Seo, Glenmont, NY (US); Injo Ok, Loudonville, NY (US); Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 0 days.

(21) Appl. No.: 16/405,849

(22) Filed: May 7, 2019

(65) Prior Publication Data

US 2020/0357898 A1   Nov. 12, 2020

(51) Int. Cl.

| | |
|---|---|
| *H01L 29/66* | (2006.01) |
| *H01L 29/78* | (2006.01) |
| *H01L 29/49* | (2006.01) |
| *H01L 29/423* | (2006.01) |
| *H01L 21/28* | (2006.01) |
| *H01L 27/088* | (2006.01) |
| *H01L 21/8234* | (2006.01) |

(52) U.S. Cl.
CPC .. *H01L 29/66545* (2013.01); *H01L 21/28088* (2013.01); *H01L 21/823412* (2013.01); *H01L 21/823437* (2013.01); *H01L 21/823487* (2013.01); *H01L 27/088* (2013.01); *H01L 29/42376* (2013.01); *H01L 29/4966* (2013.01); *H01L 29/66666* (2013.01); *H01L 29/7827* (2013.01)

(58) Field of Classification Search
CPC ............. H01L 29/66545; H01L 27/088; H01L 21/823437; H01L 29/7827; H01L 29/66666; H01L 29/4966; H01L 21/823412; H01L 21/28088; H01L 21/823487; H01L 29/42376
See application file for complete search history.

(56) References Cited

U.S. PATENT DOCUMENTS

| | | | |
|---|---|---|---|
| 6,773,994 B2 | 8/2004 | Chittipeddi et al. | |
| 9,525,064 B1 | 12/2016 | Balakrishnan et al. | |
| 9,530,863 B1* | 12/2016 | Zhang ............... | H01L 29/66666 |
| 9,530,866 B1* | 12/2016 | Zhang ................ | H01L 29/0676 |
| 9,640,636 B1* | 5/2017 | Bentley ............. | H01L 29/66545 |
| 9,773,708 B1* | 9/2017 | Zhang ............... | H01L 29/66545 |
| 9,780,208 B1 | 10/2017 | Xie et al. | |
| 9,859,421 B1 | 1/2018 | Robison et al. | |
| 9,882,047 B2 | 1/2018 | Leobandung | |
| 10,777,469 B2* | 9/2020 | Bao ................... | H01L 21/76229 |

(Continued)

*Primary Examiner* — Ismail A Muse
(74) *Attorney, Agent, or Firm* — Erik Johnson; Lou Percello, Attorney, PLLC

(57) ABSTRACT

Vertical transport field effect transistors (VTFET) are disclosed along with methods of making. The VTFET is made with a novel gate last replacement metal gate (RMG) process. The invention allows uniform and high doping levels without adversely affecting the gate region in the process. The distance from the S/D regions and the junctions are the same. Fin caps protect the fins and gate protecting hard mask protect the dummy gate material during the beginning process steps. The invention enables easy connection and increased surface area at the connection points to reduce contact resistance.

19 Claims, 13 Drawing Sheets

(56) References Cited

U.S. PATENT DOCUMENTS

| | | |
|---|---|---|
| 2016/0293756 A1 | 10/2016 | Liu et al. |
| 2019/0363026 A1* | 11/2019 | Lee .................... H01L 27/0924 |
| 2020/0118890 A1* | 4/2020 | Bao .................... H01L 29/0847 |
| 2020/0176611 A1* | 6/2020 | Lee ................ H01L 21/823814 |
| 2020/0258941 A1* | 8/2020 | Lee ................... H01L 29/66666 |
| 2020/0303503 A1* | 9/2020 | Lee ............... H01L 21/823842 |

* cited by examiner

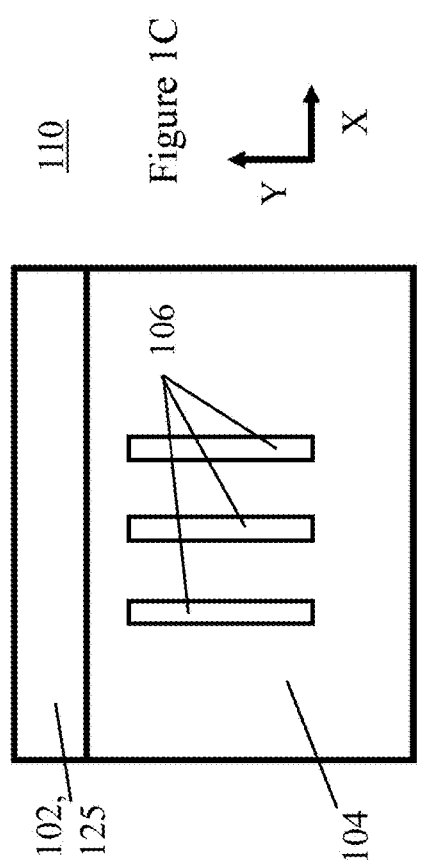
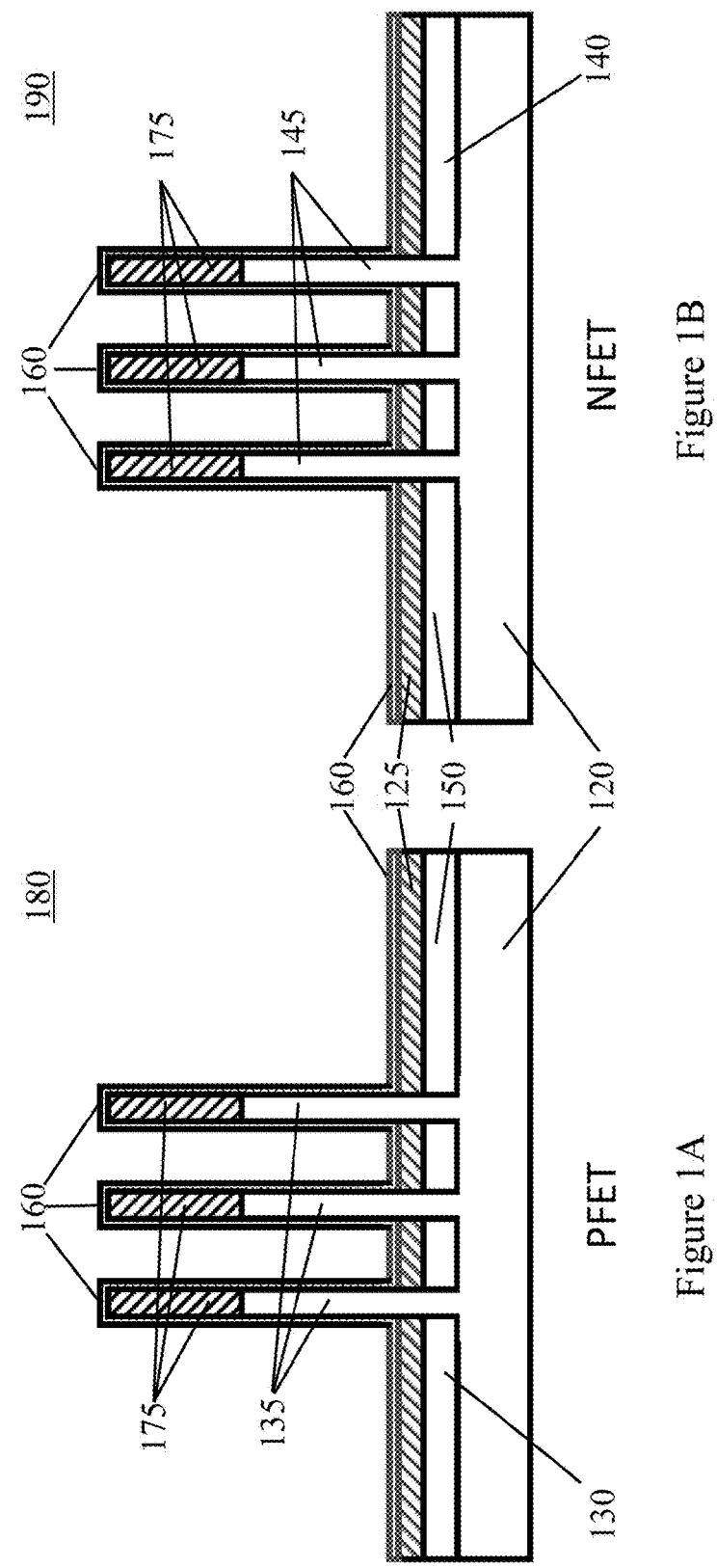
Figure 1A
Figure 1B
Figure 1C

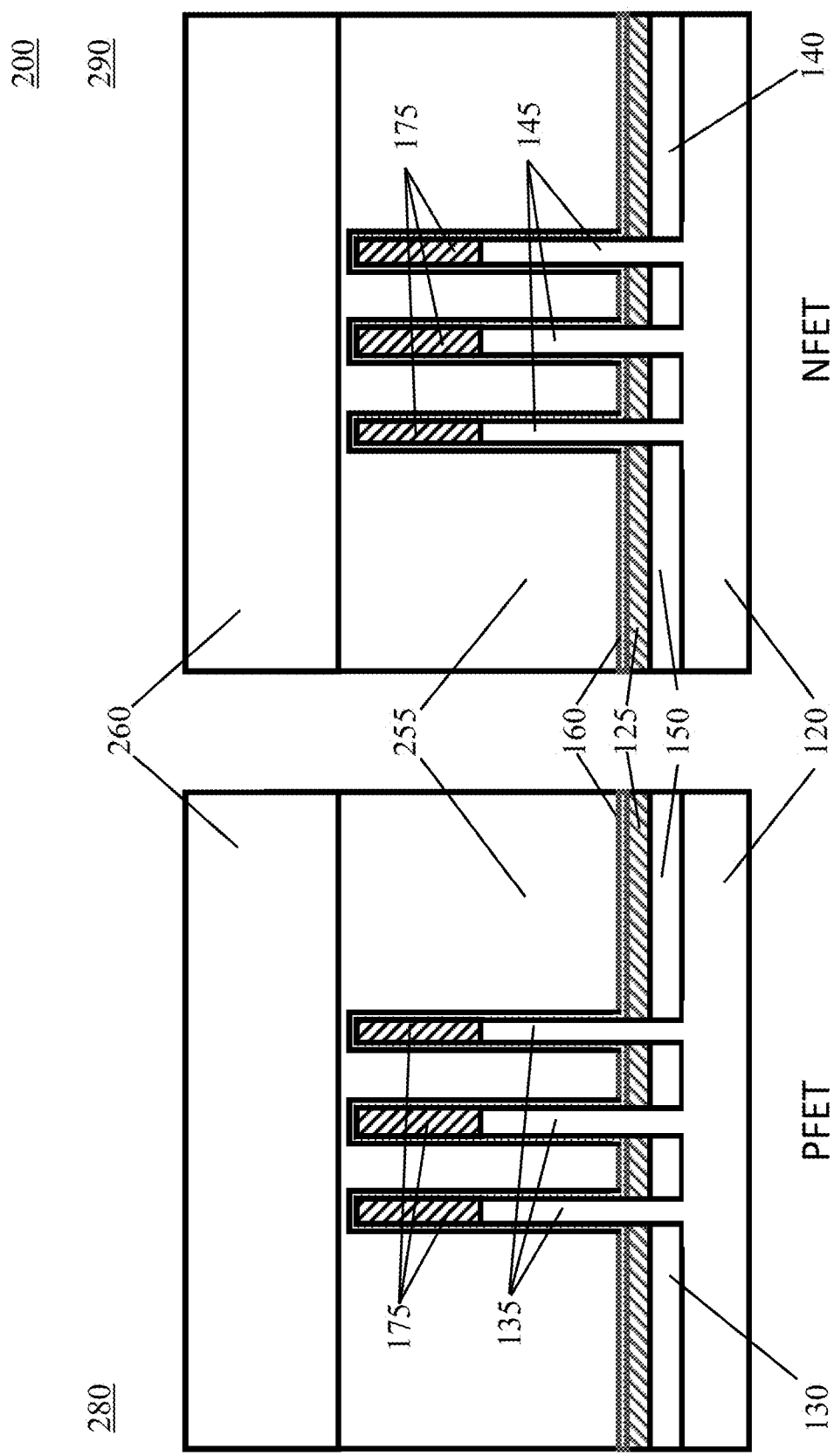
Figure 2A — PFET
Figure 2B — NFET

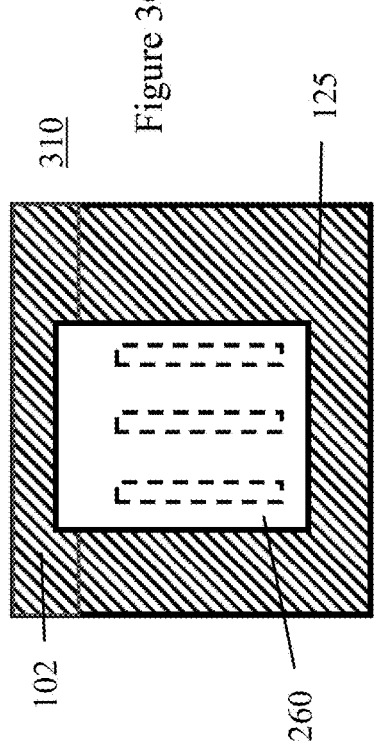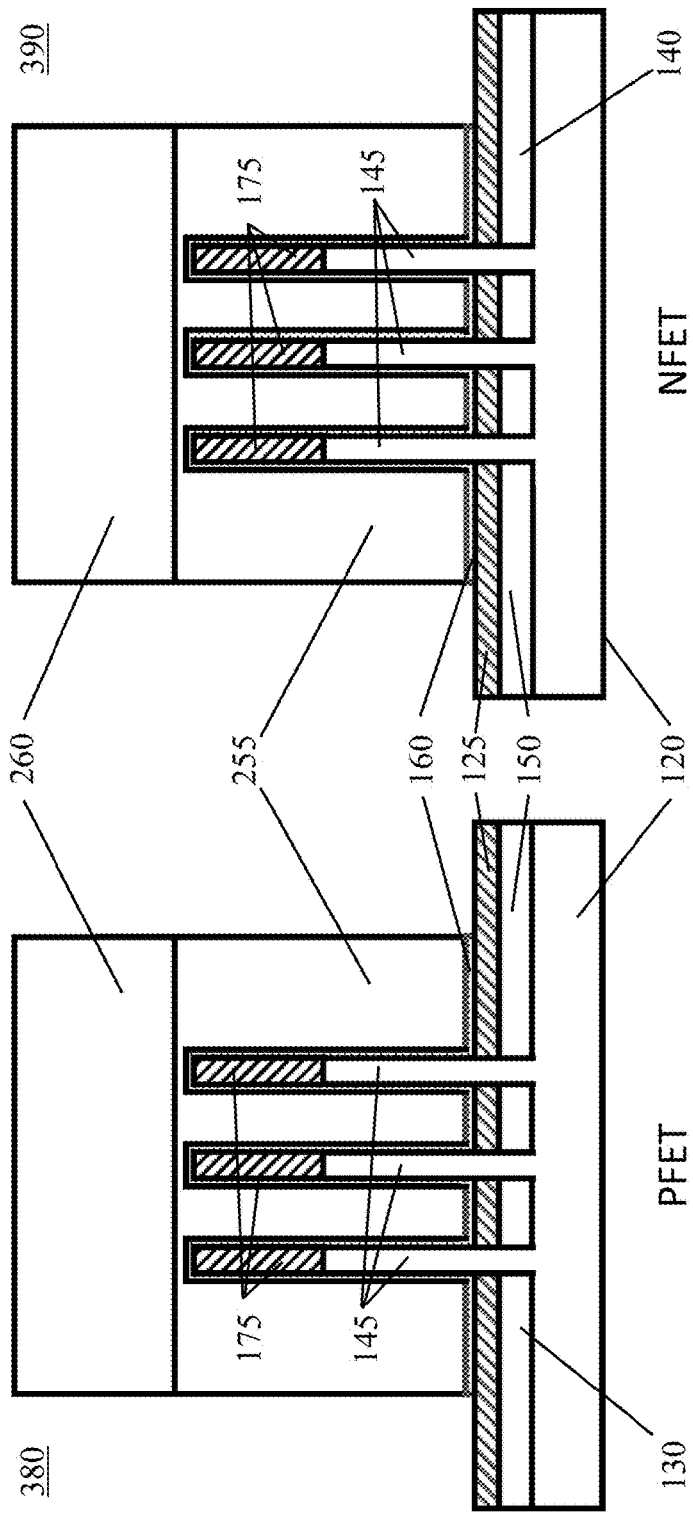

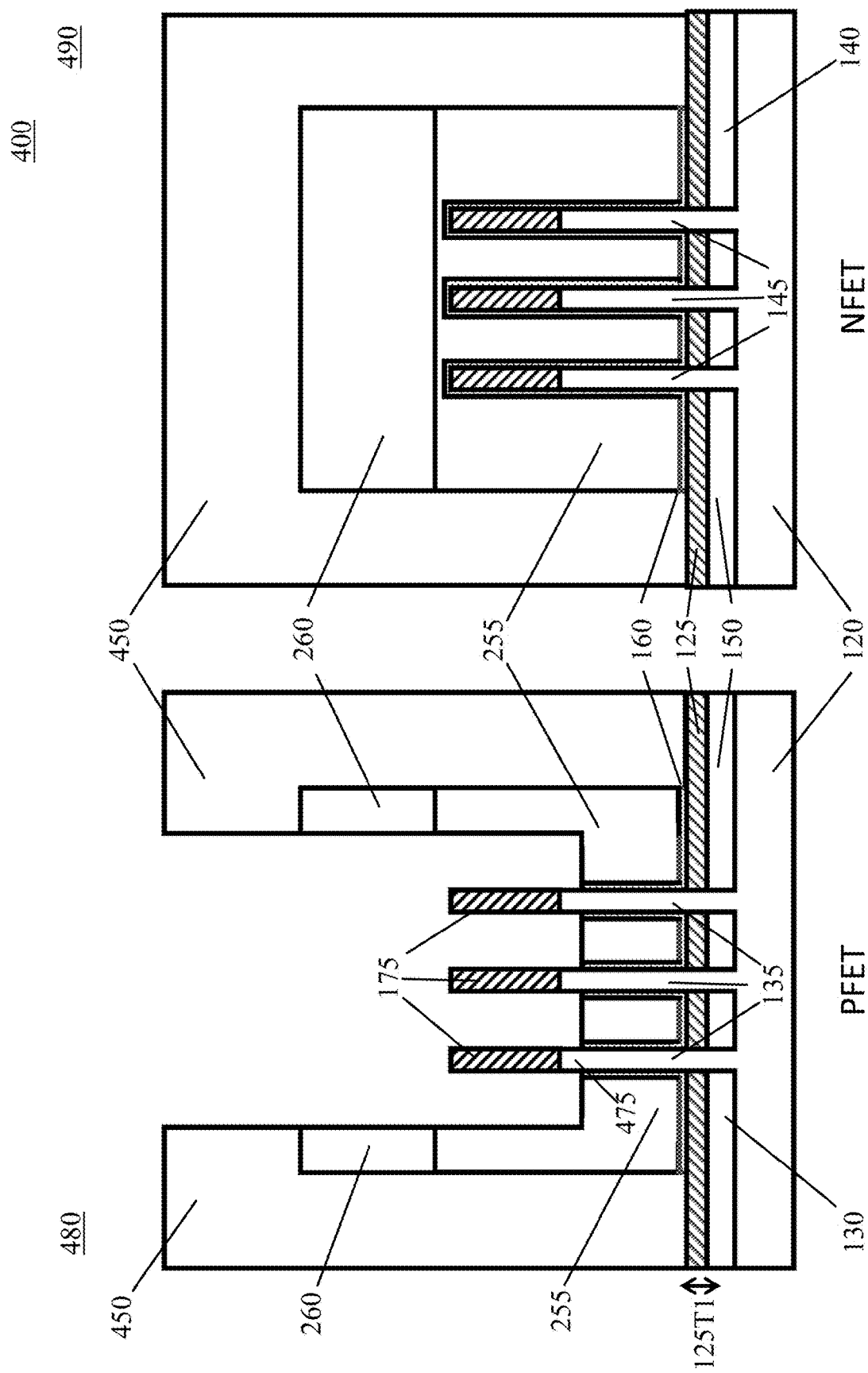

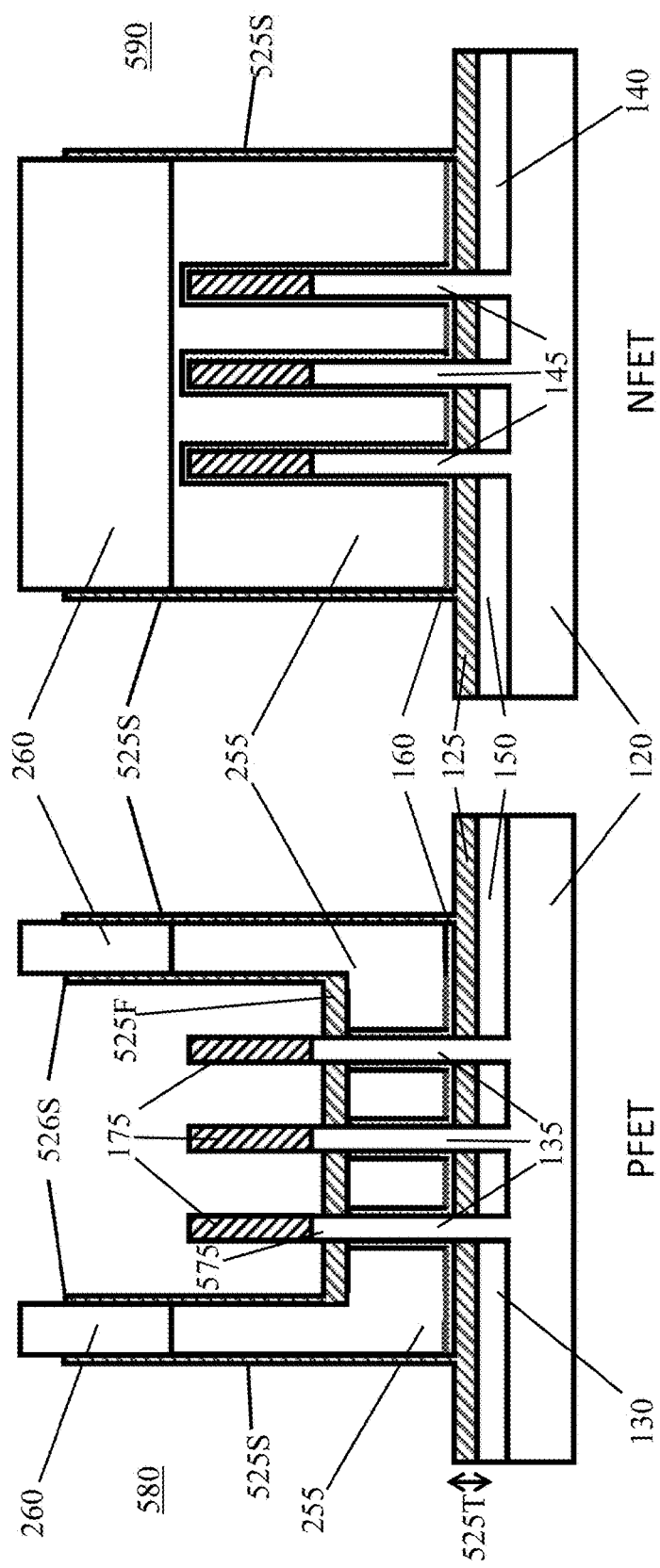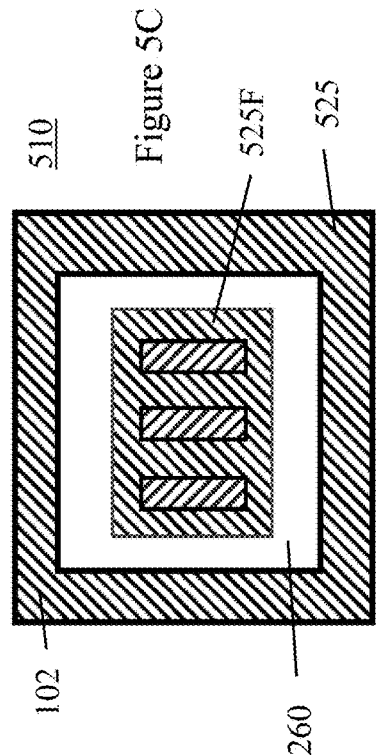

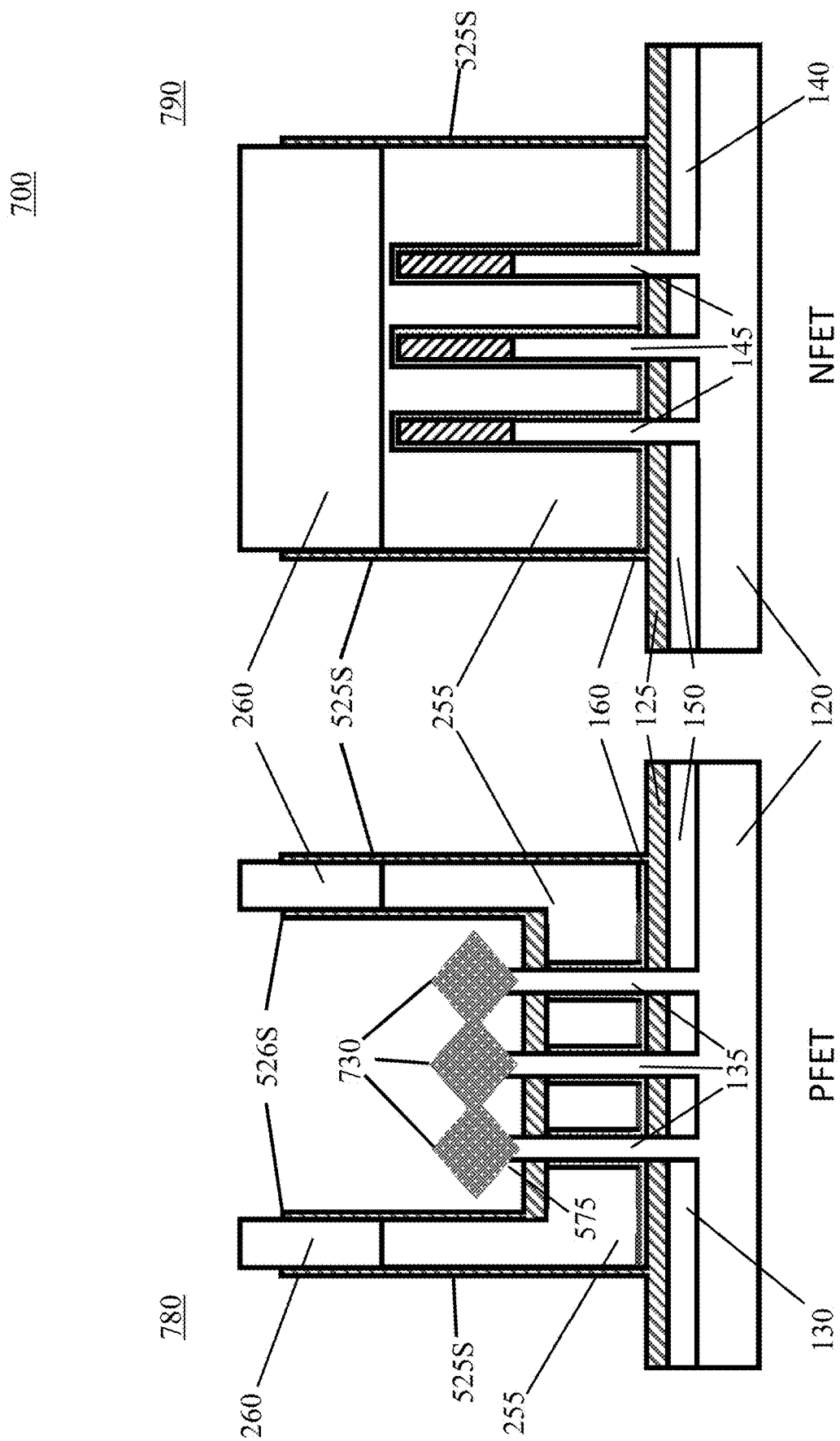

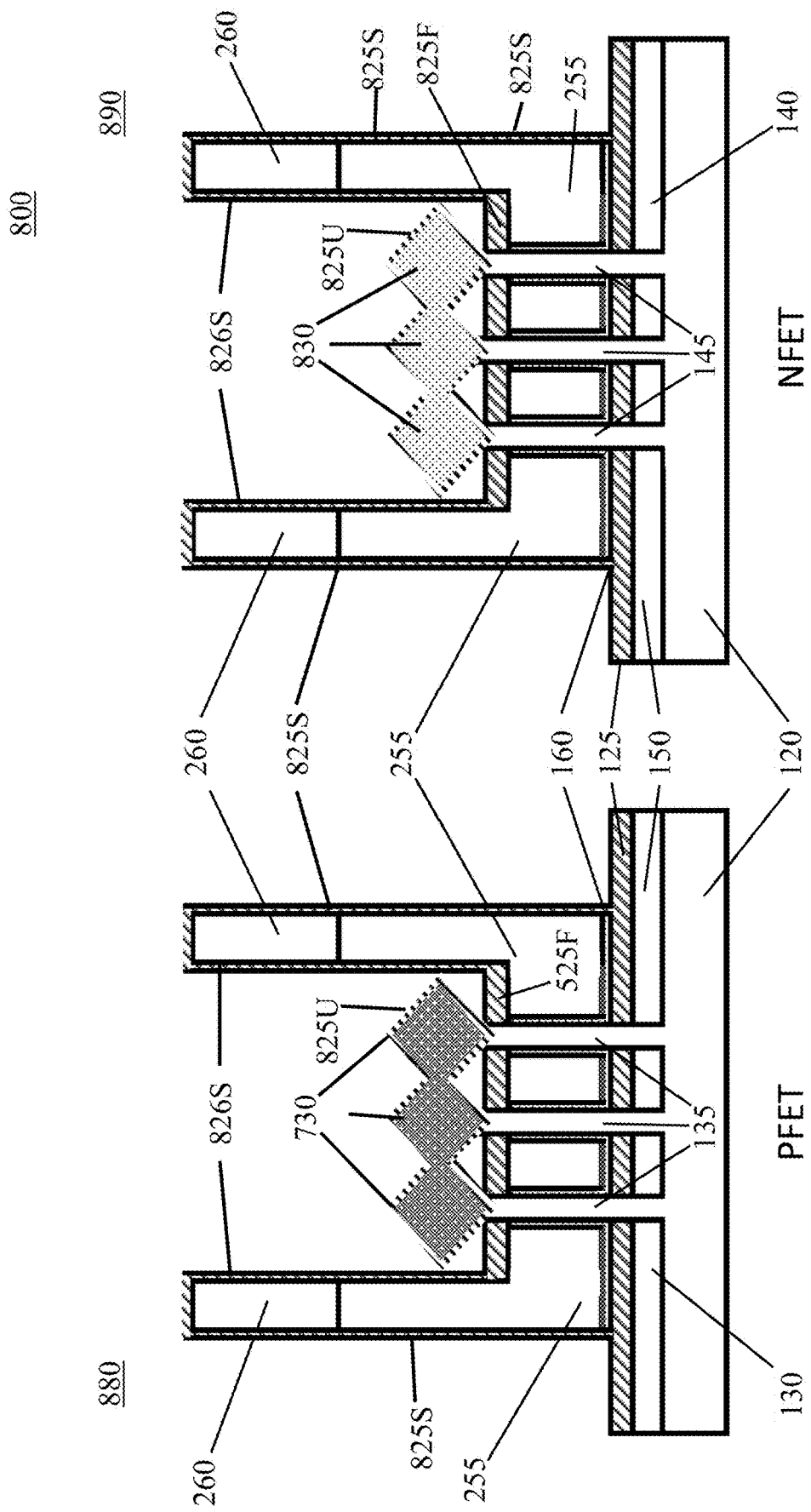

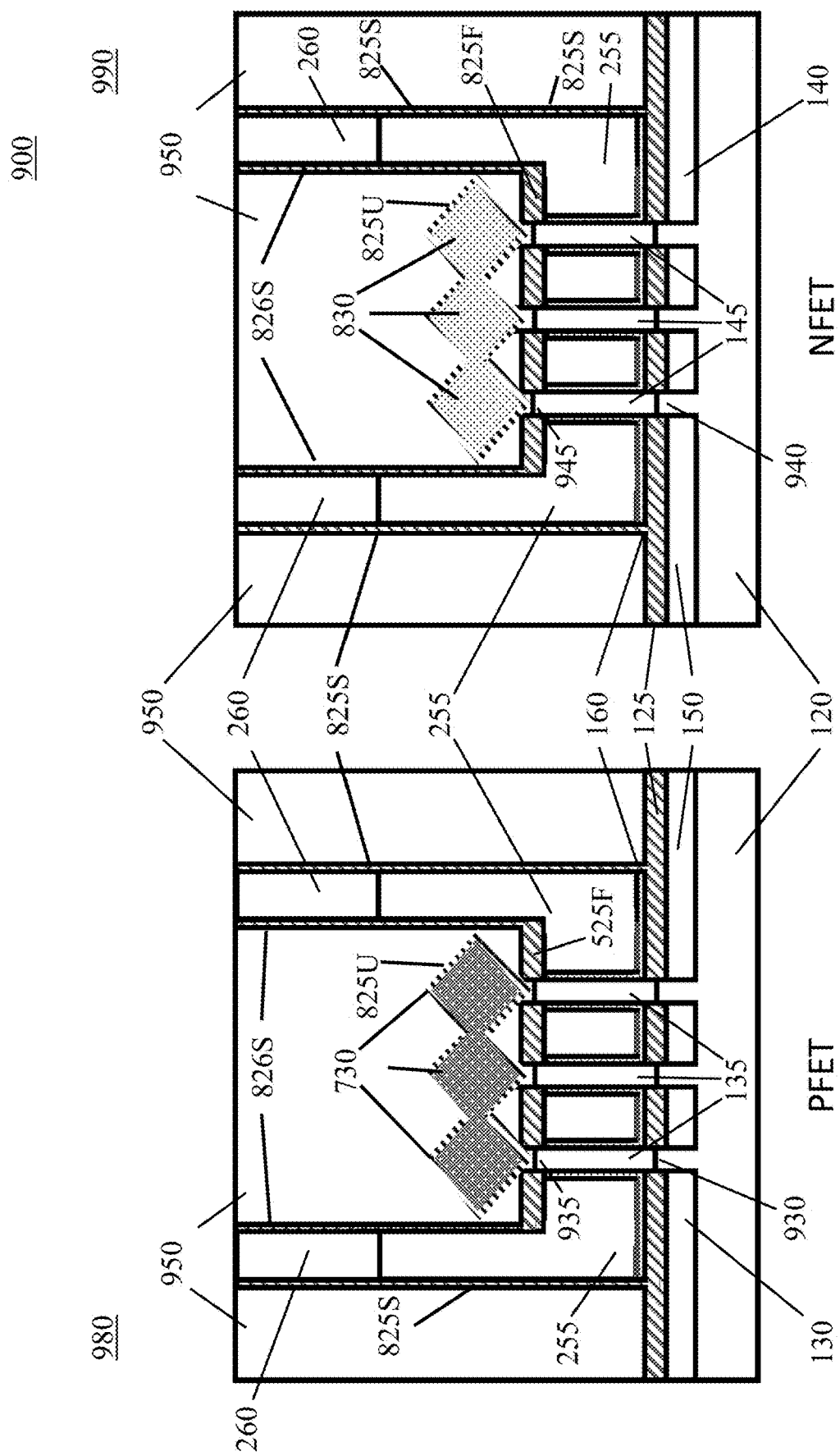
Figure 9A PFET
Figure 9B NFET

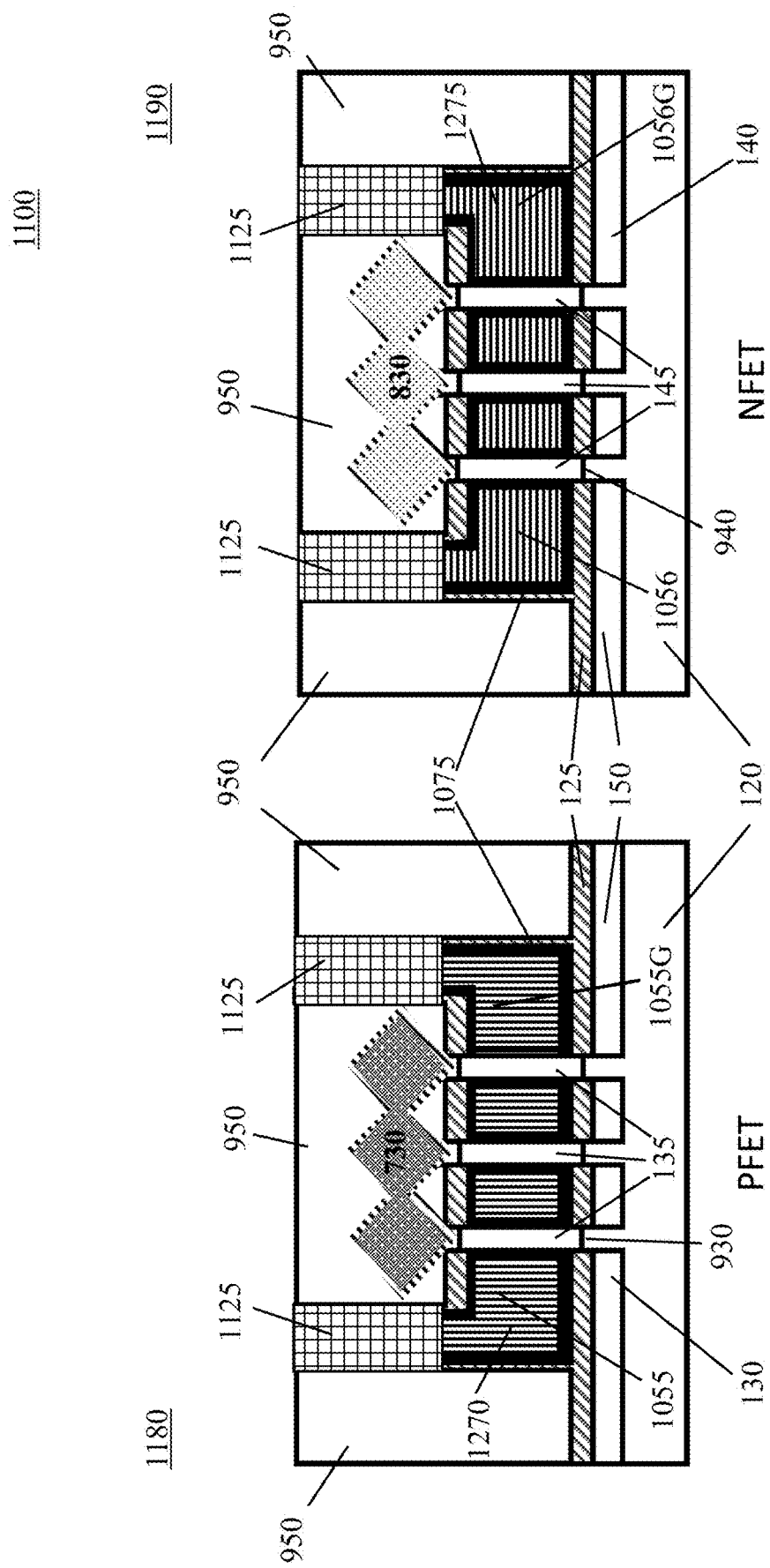

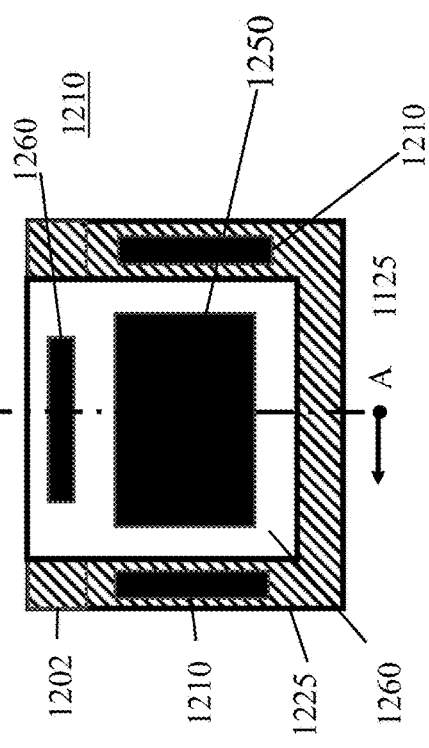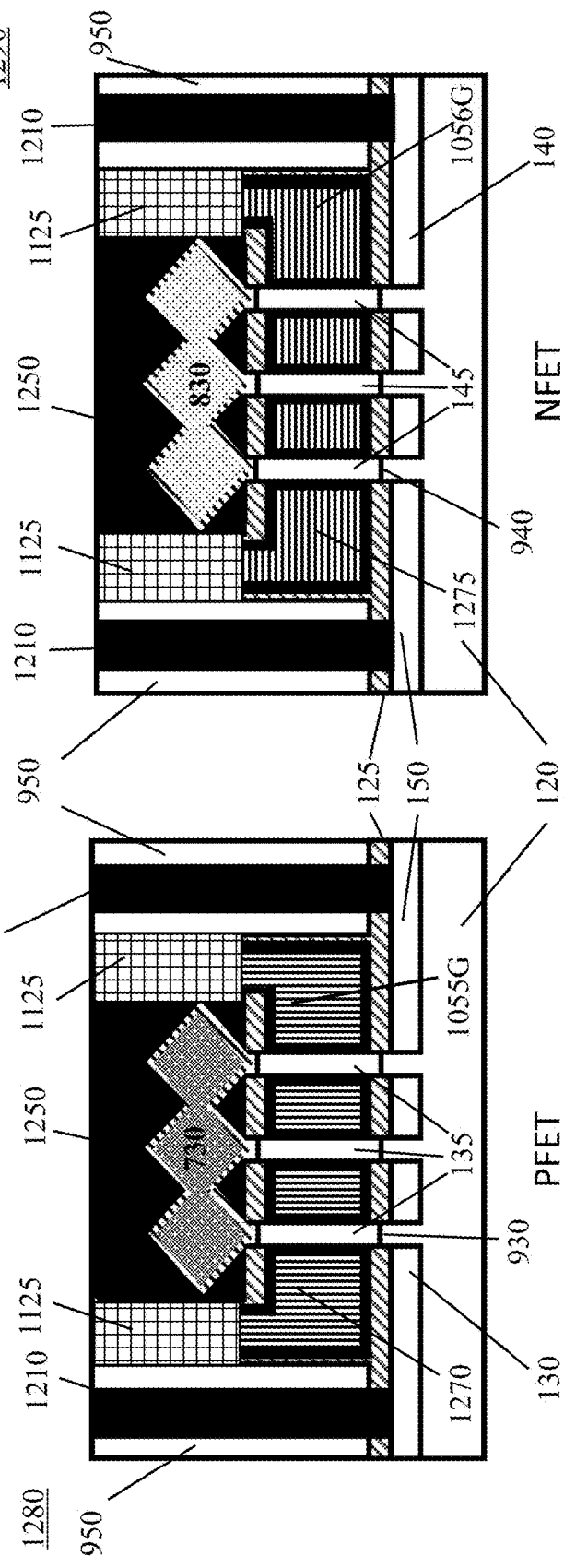
Figure 12A
Figure 12B
Figure 12C

View A-A

GATE LAST VERTICAL TRANSPORT FIELD EFFECT TRANSISTOR

BACKGROUND

This invention generally relates to semiconductor device structures and methods of manufacturing. More particularly, the invention relates to vertical transport field effect transistor (VTFETs,) both p-channel (PFET) and n-channel (NFET).

Vertical transport field effect transistors (VTFETs) are becoming viable device options for semiconductor devices below 7 nanometer (nm) technology nodes. VTFET devices include fin channels with source/drain regions on the top and bottom ends of the fin channel. Current runs through the fin channels in a vertical direction (e.g., perpendicular to a substrate), for example, from a bottom source/drain (S/D) region to a top source/drain (S/D) region. (Although the doped source and drain regions differ in size in the prior art, the source and the drain function are considered interchangeable, hence each source or drain region is referred to as a S/D region.)

VTFET manufacturing process flows have strict constraints on thermal budgets for downstream processing steps, such as top source/drain epitaxial growth and dopant activation anneal processes, when the gate conductor, or the high-k metal gate (HKMG) module, is formed earlier in the manufacturing process than the S/D formation. In these "gate first-like" processing methods, the HKMG is adversely affected by high temperature process steps that might be required for source/drain (S/D) development later in the process flow. For example, high temperature processes (e.g., greater than 550 degrees Celsius (° C.)) for top source/drain module can cause a shift in threshold voltage, increase in equivalent oxide thickness, and leakage current metric degradation due to oxygen and metal diffusion into the channel.

Replacement metal gate (RMG) process flows for VTFETs address the thermal budget issues by installing the gate later in the process flow, e.g. "gate last." However, VTFET structures made by RMG processes can be more complicated than VTFET's made with their gate first in the process flow. In addition, gate and S/D metal connections to the VTFET are harder to make to VTFET with RMG processes.

SUMMARY

A vertical transport field effect transistor (VTFET) with replacement metal gates is disclosed. The VTFET has a substrate layer, an epitaxial (or bottom source/drain, S/D) layer disposed on the substrate layer, and a plurality of semiconductor fins that are perpendicular to the substrate layer. Each of the fins has a bottom, a channel, and a top. The bottom of each fin is electrically and mechanically connected to and surrounded by the bottom S/D layer. The bottom and top of the fins are doped and the channel is undoped or doped very minimally. A top S/D layer is electrically and mechanically connected to and surrounds the tops of each of the fins.

In some embodiments, while the bottom S/D layer grows, silicon-germanium (SiGe) fin caps protect and shield the fin tops. Then the SiGe fin caps are selectively removed to enable growth of the top S/D layer.

During an anneal step, the dopants simultaneously diffuse from the bottom and top S/D layer into the bottom and the top of the fins, respectively, so that the penetration distance into the top and bottom of the fin is equal within a very small tolerance, e.g. 6 nm. The result is a VTFET with S/D regions very symmetrical which improves the electrical characteristics of the device.

During the epitaxial growth of the bottom and top S/D layers and a later anneal step, a gate protecting hard mask protects a dummy gate volume between the top and bottom S/D layers until the gate is ready for formation. The high temperatures experienced during the S/D layer growth and anneal steps occur before the gate is formed.

In one embodiment, at least two gate cap layers electrically insulate a work function metal in the gate from the top of the VTFET and from the top S/D layer. An exterior dielectric is disposed on and around the gate volume and gate cap layers.

In an embodiment, a top S/D contact is electrically connected to the top S/D layer and is placed within the gate caps. In an embodiment, at least one bottom S/D contact passes from the top of and though the exterior dielectric to physically and electrically contact the bottom S/D layer. In an embodiment, a gate contact passes from the top of and through the exterior dielectric to physically and electrically contact the work function metal.

BRIEF DESCRIPTION OF THE DRAWINGS

Embodiments of the present invention will be described below in more detail, with reference to the accompanying drawings, briefly described below. The Figures show various structures and related method steps.

FIG. 1A is an initial structure for a PFET.

FIG. 1B is an initial structure for an NFET.

FIG. 1C is a plan view of an initial wafer surface showing a Shallow Trench Isolation (STI) area and an active area.

FIG. 2A is a PFET structure after a deposition of a removable dummy gate material and a hard mask.

FIG. 2B is an NFET structure after a deposition of a removable dummy gate material and a hard mask.

FIG. 3A is an elevation cross section view of a PFET after an etch step in the process.

FIG. 3B is an elevation cross section view of an NFET after an etch step in the process.

FIG. 3C is a plan view of a device footprint defined by an etch step.

FIG. 4A is an elevation cross section view of the PFET structure of FIG. 3A after an etch step exposes the PFET fins.

FIG. 4B is an elevation cross section view of the NFET showing the fins remaining unexposed.

FIG. 5A is an elevation cross section view of the PFET structure of FIG. 4A after a striping process and deposition of a spacer material around the base of the fins and around the base exterior to the PFET structure.

FIG. 5B is an elevation cross section view of the NFET structure with spacer material added around the base exterior to the NFET structure.

FIG. 5C is a plan view of FIG. 5A.

FIG. 7A is an elevation cross section view of the PFET structure of FIG. 6A during an epitaxial growth of a top S/D region of the PFET structure.

FIG. 7B is an elevation cross section view of the NFET structure of FIG. 6B showing no change to the NFET structure in this process step.

FIG. 8A shows the PFET structure in elevation cross section view after a series of steps creating a top S/D region in the NFET structure followed by a covering with a layer.

FIG. 8B shows the NFET structure in elevation cross section view after a series of steps creating a top S/D region in the NFET structure and followed by a covering with a layer.

FIG. 9A shows the PFET structure in elevation cross section view after experiencing a single anneal step that diffuses dopants equal distances from the fin top and bottoms and after the further steps of dielectric deposition and chemical mechanical polishing (CMP).

FIG. 9B shows the NFET structure in elevation cross section view after experiencing a single anneal step that diffuses dopants equal distances from the fin top and bottoms and after the further steps of dielectric deposition and chemical mechanical polishing (CMP).

FIG. 11A is an elevation cross section views of the PFET structure showing some of the metal gate connections being replaced with dielectric material to chemically and electrically isolate the gate metal from the top of the device and the top S/D region.

FIG. 11B is an elevation cross section view of the NFET structure showing some of the metal gate connections being replaced with dielectric material to chemically and electrically isolate the gate metal from the top of the device and the top S/D region.

FIG. 12A is an elevation cross section view of the PFET structure showing removal of material from the structure to allow deposition of electrical contacts to the top and bottom S/D regions.

FIG. 12B is an elevation cross section view of the NFET structure showing removal of material from the structure to allow deposition of electrical contacts to the top and bottom S/D regions.

FIG. 12C is a plan view showing a novel electrical connection to the metal gate and S/D layers.

DETAILED DESCRIPTION

Figures 6A, 6B:
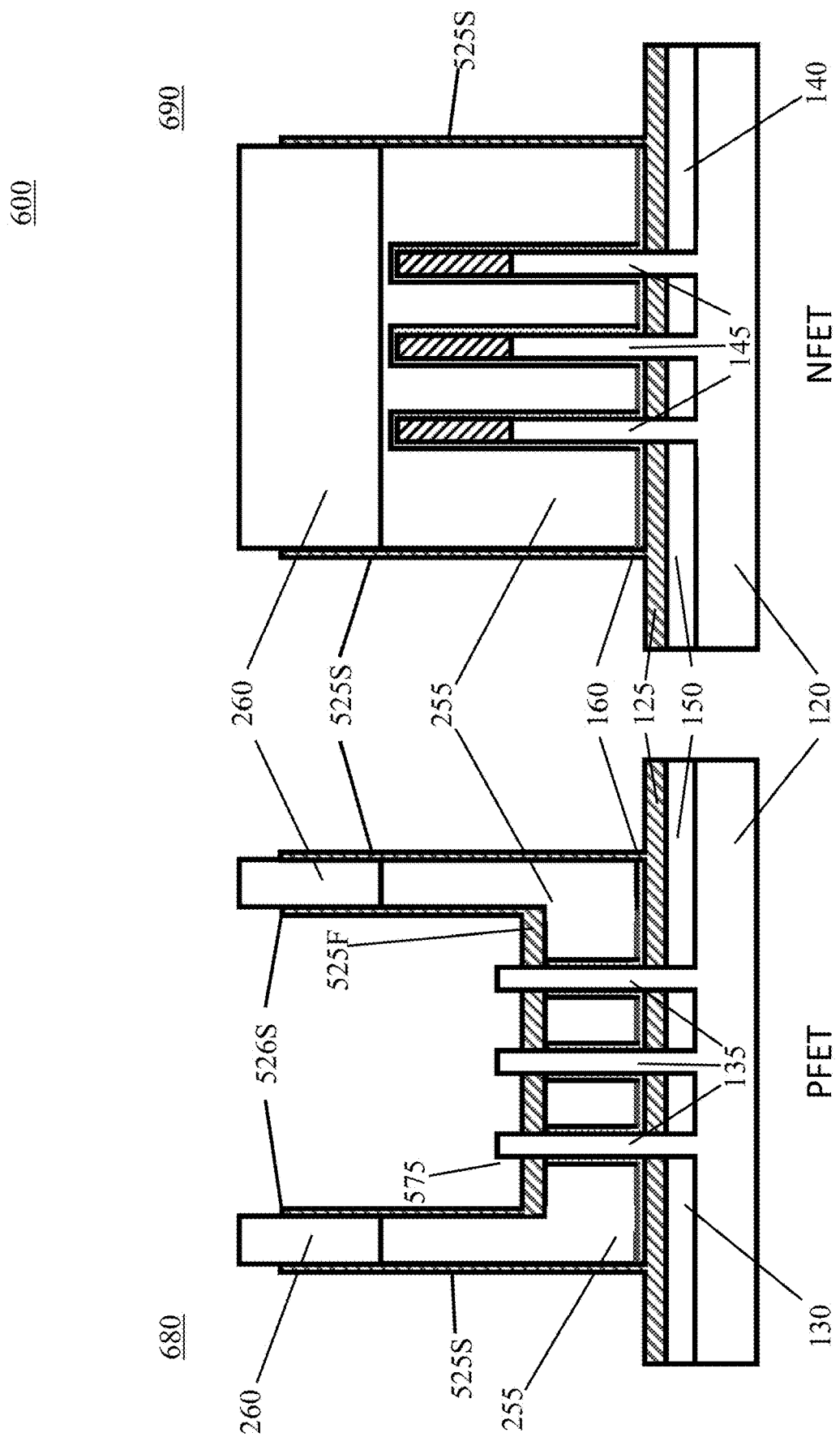
FIG. 6A is an elevation cross section view of the PFET structure of FIG. 5A with fin tops exposed after removal of protective caps.
FIG. 6B is an elevation of the NFET structure of FIG. 5B showing no change in this process step.

Exemplary embodiments of the invention will now be discussed in further detail regarding semiconductor devices, structures, and methods of manufacturing and using these VTFET devices and structures.

Illustrative embodiments of the invention may be described herein in the context of illustrative methods for replacement metal gate (RMG) processes for VTFETs, along with illustrative apparatus, systems and devices formed using such methods. However, it is to be understood that embodiments of the invention are not limited to these illustrative methods, apparatus, systems and devices but instead are more broadly applicable to other alternative and broader methods, apparatus, systems and devices that become evident to those skilled in the art given this disclosure.

In addition, it is to be understood that the various layers and/or regions shown in the accompanying drawings are not drawn to scale, and that one or more layers and/or regions of a type commonly used in, for example, FinFET, VTFET, CMOS, field-effect transistor (FET), nanowire FET, nanosheet FETs, metal-oxide-semiconductor field-effect transistor (MOSFET), single electron transistor (SET) and/or other semiconductor devices may not be explicitly shown in a given drawing. This does not imply that the layers and/or regions not explicitly shown are omitted from the actual devices.

In addition, certain elements may be left out of particular views for the sake of clarity and/or simplicity when explanations are not necessarily focused on such omitted elements. Moreover, the same or similar reference numbers used throughout the drawings are used to denote the same or similar features, elements, or structures, and thus, a detailed explanation of the same or similar features, elements, or structures will not be repeated for each of the drawings.

The semiconductor devices, structures, and methods for forming these devices and structures in accordance with embodiments of the present invention can be employed in applications, hardware, and/or electronic systems. Suitable hardware and systems for implementing embodiments of the invention may include, but are not limited to, personal computers, communication networks, electronic commerce systems, portable communications devices (e.g., cell and smart phones), solid-state media storage devices, expert and artificial intelligence systems, functional circuitry, etc. Systems and hardware incorporating the semiconductor devices are contemplated embodiments of the invention.

As used herein, "height" refers to a vertical size of an element (e.g., a layer, trench, hole, opening, etc.) in the cross-sectional or elevation views measured from a bottom surface to a top surface of the element, and/or measured with respect to a surface on which the element is located.

Conversely, a "depth" refers to a vertical size of an element (e.g., a layer, trench, hole, opening, etc.) in the cross-sectional or elevation views measured from a top surface to a bottom surface of the element. Terms such as "thick", "thickness", "thin" or derivatives thereof may be used in place of "height" where indicated.

As used herein, "lateral," "lateral side," and "lateral surface" refer to a side surface of an element (e.g., a layer, opening, etc.), such as a left or right-side surface in the drawings.

As used herein, "width" or "length" refers to a size of an element (e.g., a layer, trench, hole, opening, etc.) in the drawings measured from a side surface to an opposite surface of the element. Terms such as "thick", "thickness", "thin" or derivatives thereof may be used in place of "width" or "length" where indicated.

As used herein, terms such as "upper", "lower", "right", "left", "vertical", "horizontal", "top", "bottom", and derivatives thereof shall relate to the disclosed structures and methods, as oriented in the drawing figures. For example, as used herein, "vertical" refers to a direction perpendicular to the top surface of the substrate in the elevation views, and "horizontal" refers to a direction parallel to the top surface of the substrate in the elevation views.

As used herein, unless otherwise specified, terms such as "on", "overlying", "atop", "on top", "positioned on" or "positioned atop" mean that a first element is present on a second element, wherein intervening elements may be present between the first element and the second element. As used herein, unless otherwise specified, the term "directly" used in connection with the terms "on", "overlying", "atop", "on top", "positioned on" or "positioned atop," "disposed on," or the terms "in contact" or "direct contact" means that a first element and a second element are connected without any intervening elements, such as, for example, intermediary conducting, insulating or semiconductor layers, present between the first element and the second element.

It is understood that these terms might be affected by the orientation of the device described. For example, while the meaning of these descriptions might change if the device was rotated upside down, the descriptions remain valid because they describe relative relationships between features of the invention.

FIG. 1C is a plan view (as described below in more detail) of an initial substrate surface 110 showing a Shallow Trench Isolation (STI) area 102 and an active area 104. FIG. 1A is an initial structure for making a PFET. FIG. 1B is an initial structure for making an NFET. FIGS. 1A, 1B, and 1C also show the process step 100 for making the initial structures for the PFET and NFET devices.

In an embodiment, there is a bottom isolation layer or substrate layer 120. An epitaxial layer 150 is deposited on the substrate layer 120 in the active region 104. There is also an STI area 102 patterned into the substrate layer 120, as described below. In an embodiment, the top of the STI region 102 is coplanar with the top surface of the epitaxial layer 150, as described below. The STI region is made of dielectric, electrically insulating material, like SiO2, on which no epitaxial layer can grow directly.

In an embodiment, the bottom isolation layer 120 is made of bulk semiconductor material including, but not limited to, silicon (Si), silicon germanium (SiGe), carbon doped silicon (Si:C), carbon doped silicon germanium (SiGe:C), III-V compound semiconductors, II-V compound semiconductors, or other like semiconductors. In addition, multiple layers of the semiconductor materials can be used. The bottom isolation layer 120 can be a bulk substrate or a semiconductor-on-insulator substrate such as, but not limited to, a silicon-on-insulator (SOI), silicon-germanium-on-insulator (SGOI) or III-V-on-insulator substrate including a buried insulating layer, such as, for example, a buried oxide, nitride layer or aluminum oxide. Alternative semiconductor materials also can be employed as the bottom isolation layer 120, such as, but not limited to, germanium (Ge), gallium arsenide (GaAs), cadmium telluride (CdTe), zinc selenide (ZnSe), etc.

In embodiments, the fins (135, 145) are formed by patterning the substrate 120 and thus the fins (135, 145) are formed of the same material as the substrate 120.

In other embodiments, the fins (135, 145) and fin caps 175 are formed by patterning the substrate 120 with a fin cap material disposed on the substrate 120. In an embodiment, the fin caps 175 are made of silicon germanium (SiGe).

Each of the fins (135, 145) may have a width or horizontal thickness (in direction X-X') in the range of 5 nanometers (nm) to 10 nm, although other widths above or below this range may be used as desired for a particular application. Each of the fins (135, 145) may have a height or vertical thickness (in direction perpendicular to the substrate 120 and respective epitaxial layers—130, 140) ranging from 30 nm to 150 nm, although other heights above or below this range may be used as desired for a particular application. A spacing between adjacent fins (135, 145) may be in the range of 20 nm to 100 nm, although other spacing may be used as desired for a particular application.

In a preferred embodiment, the fins (135, 145) are made of silicon, Si.

The SiGe material protects the fin (135, 145) structure, e.g. the fin tops, during later processing steps, and is easily and selectively removed when the top of the fin (135, 145) needs to be exposed for later epitaxial growth of the top S/D layer. Importantly, the SiGe caps 175 can be removed while not removing other protective material, e.g. a gate protecting hard mask 260, described below.

A bottom epitaxial layer 150 (130, 140 for the PFET, NFET, respectively) is disposed on the bottom isolation area/substrate 120 in the active area 104. The bottom S/D regions of the bottom epitaxial layer (130, 140 respectively) are electrically and mechanically connected to the and surround the fins (135, 145, respectively) in the initial PFET 180 and NFET 190 structures, respectively, shown in FIGS. 1A and 1B.

In an embodiment, the bottom S/D epitaxial layer 150 (130 and 140 for the PFET and NFET, respectively) is made of silicon or silicon germanium. In other embodiments, epitaxial layer 150 materials could include: silicon carbide (SiC); carbon doped silicon (Si:C); silicon germanium carbide (SiGeC); carbon doped silicon germanium (SiGe:C); III-V; II-V compound semiconductor; or other like semiconductor or multi-layers of some of these materials. Boron-doped silicon germanium (SiGeB) can be used for the bottom S/D epitaxial layer 130 for the PFET 180.

The bottom S/D epitaxial layer 150 (i.e., 130, 140) may have a height or vertical thickness (in direction axially along the fins) in the range of 10 nm to 30 nm, although other heights above or below this range may be used as desired for a particular application.

The bottom S/D epitaxial layers (130, 140) may be epitaxially grown from gaseous or liquid precursors. Epitaxial materials may be grown using vapor-phase epitaxy (VPE), molecular-beam epitaxy (MBE), liquid-phase epitaxy (LPE), rapid thermal chemical vapor deposition (RT-CVD), metal organic chemical vapor deposition (MOCVD), ultra-high vacuum chemical vapor deposition (UHVCVD), low-pressure chemical vapor deposition (LPCVD), limited reaction processing CVD (LRPCVD), or other suitable processes. The temperature for an epitaxial deposition process can range from 500° C. to 900° C. Although higher temperature typically results in faster deposition, the faster deposition may result in crystal defects and film cracking.

Dopants may include, for example, in the epitaxial layer 130 a p-type dopant (PFET, 180) selected from a group of boron (B), gallium (Ga), indium (In), and thallium (Tl) and in the epitaxial layer 140 an n-type dopant (NFET, 190) selected from a group of phosphorus (P), arsenic (As) and antimony (Sb), at various concentrations. For example, in a non-limiting example, a dopant concentration range may be $1 \times 10^{18}$ cm$^{-3}$ to $3 \times 10^{21}$ cm$^{-3}$, or preferably between $2 \times 10^{20}$ cm$^{-3}$ to $1 \times 10^{21}$ cm$^{-3}$.

According to an embodiment, the bottom epitaxial layer 130 is boron doping for the PFET structure 180, and the bottom epitaxial layer 140 is phosphorous doping for the NFET structure 190.

A spacer layer 125 is disposed on the bottom epitaxial layer 150 and on the STI region 102. The spacer layer 125 is an electrically insulating layer that insulates electrical contact to the epitaxial layers (130, 140) from layers and materials, like the later formed gate, formed above the spacer layer 125. In embodiments, spacer layer materials include but are not limited to silicon nitride (SiN), silicon boron nitride (SiBN), siliconborocarbonitride (SiBCN), silicon oxycarbonitride (SiOCN), or silicon oxide.

In an embodiment, the spacer layer 125 is comprised of SiO2, SiBCN, SiOCN, or SiN.

Non-limited examples of deposition techniques for applying the spacer layer 125 include: Chemical Vapor Deposition (CVD), Plasma Enhanced Chemical Vapor Deposition (PECVD), Radio Frequency Chemical Vapor Deposition (RFCVD,) Physical Vapor Deposition (PVD), Atomic Layer Deposition (ALD), Pulsed Laser Deposition (PLD), Liquid Source Misted Chemical Deposition (LSMCD), and/or sputtering. In an embodiment, spacer 125 is deposited using a non-conformal deposition, e.g. a high-density plasma (HDP) deposition followed by and etch-back process. This process provides a thicker film deposition at the bottom horizontal surface and a thin deposition (not shown) on the vertical sides.

At this point in the process 100, the STI region 102 and the entire structures (180, 190) in the active area 104 are conformally covered by a disposed liner layer 160. The liner layer 160 also covers the spacer layer 125, sides of the fins (135, 145), and the top and sides of the fin caps 175. The liner layer 160 is preferably a silicon oxide material like SiO2.

The STI layer is first formed by etching a trench in the STI region into the substrate layer 120. The trench is deep enough into the substrate layer 120 so that a thickness of STI material can be deposited with about a 100 nm thickness and with a top STI surface coplanar with the top surface of the epitaxial layers 150 (i.e. 130, 140).

The STI region 102 is made of electrically insulating material, like SiO2 or SiN. Other electrically insulating dielectric materials used in the STI layer 102 include but are not limited to: low-temperature oxide (LTO), high-temperature oxide (HTO), flowable oxide (FOX), silicon oxycarbide (SiOC), and silicon oxycarbonitride (SiOCN).

Dielectric materials, like the spacer layer 125 and the liner layer 160, can be deposited on the STI region 102 using deposition techniques as described above.

Note that the plan view in FIG. 1C is not to scale and only shows the relative positions of the active region 104, fin structures 106, and STI region 102. Also FIG. 1C does not show the spacer layer 125 or the liner layer 160, so the STI region 120, active region 104, fin structures 106 (without fin caps 175) are revealed. FIG. 1C is not an accurate depiction of the materials used in the structures.

FIG. 2A is a PFET structure 280 and FIG. 2B is an NFET structure 290 after a deposition of a removable dummy gate material 255, like amorphous silicon (α-Si), and a hard mask 260. In an embodiment, the dummy gate material 255 is deposited and then a chemical mechanical polishing step is performed before the hard mask 260 is deposited.

The dummy gate material 255 and the hard mask 260 can by deposited by Chemical Vapor Deposition (CVD), Physical Vapor Deposition (PVD), or Atomic Layer Deposition (ALD) processes 200.

The hard mask 260 is a lithographic protective material including any one of the following materials: SiN, SiBCN, SiOCN, and SiON. Note that this material is different than the SiGe fin cap 175 so that the fin caps 175 can be selectively removed later without affecting the hard mask 260.

FIG. 3C shows a plan view of structures 310 in elevation cross section view for the PFETs (FIG. 3A) and NFETs (FIG. 3B). The structures (380, 390) are defined by a lithographic masking and reactive ion etching (RIE) step with chemistries and/or timing that remove some of the hard mask 260, α-Si dummy gate 255, and liner 160 to define the initial structure locations for the PFET 380 and NFET 390 devices and to expose the spacer layer 125 around the base of the structures (380, 390). In this step 300, the region where the gate will be replaced, e.g. the dummy gate material 255, is also defined and exposed.

Note that FIG. 3C is not to scale and only shows relative positions of the fin structures, hard mask 260, exposed spacer 125, and STI region 102.

FIG. 4A shows the PFET 480 and FIG. 4B shows the NFET 490 structures after the process steps 400 are performed.

In steps 400, an Organic Planarization Layer (OPL) 450 is deposited everywhere over and around structures 480 and 490 to protect the structures that were defined in step 300. In an embodiment, the OPL 450 is a polar lithographic material.

A masked etch step (not shown) is then performed where the NFET structure 490 remains protected and unetched while layers in the PFET structure 480 are etched away to expose the fin caps 175 and an upper portion 475 of the fins 135. Part of the layer 450, part of the hard mask 260, part of the dummy gate material 255, and part of the liner 160 along the sides of the fins 135 in the PFET structure 480 are etched away to expose between 4-10 nm of the upper part 475 of the PFET fins 135. In a preferred embodiment 4-6 nm of the upper part 475 of the fins 135 are exposed.

The material is removed from the PFET structure 480 using a selective Reactive Ion Etch (RIE). The fin caps 175 are less affected by the selective RIE and protect the top of the fins 135. The fin caps 175 protect the fins and help insure that the fins (135, 145) are of uniform length when the process steps are completed.

FIGS. 5A, 5B, and 5C show structures after performing the steps of process 500 including: FIG. 5A showing an elevation cross section view of the PFET structure; FIG. 5C showing a plan view of FIG. 5A, not to scale; and FIG. 5B showing an elevation cross section view of the NFET structure.

Process 500 begins by removing all the OPL 450 spread over the surface, including the OPL 450 on both the PFET 580 and NFET 590 structures.

Then a High-Density Plasma (HDP) low-k dielectric material deposition is performed to form the top spacer 525F in the same manner as bottom spacer 125 was formed. This non-conformal deposition also forms a low-k dielectric material layer 525S on the vertical, external sides of the structures (580, 590) and on the inside vertical sides 526S of the dummy gate 255 and gate cap hard mask 260. The deposition also covers the top of the gate cap hard mask 260 (not shown). Since the HDP low-k dielectric material deposition is non-conformal, in embodiments, the horizontal depositions, e.g. on the top spacer 525F, will be thicker than the vertical depositions, e.g. on the sides 525S and 526S. The thickness of the vertical depositions (525S and 526S) is between 2-10 nm.

In an embodiment, the spacer material is the same material 125 used in process step 100. In an embodiment this material is an insulator/dielectric like silicon nitride (SiN) or silicon oxide. Alternative materials that can be used for this low-k dielectric deposition in step 500 include: silicon boron nitride (SiBN), siliconborocarbonitride (SiBCN), or silicon oxycarbonitride (SiOCN).

A directional (top down) RIE step is performed to remove the spacer material from the top of the gate cap hard mask 260 and to take material from the top of the vertical depositions (525S, 526S) to shorten these vertical depositions. This exposes more of the top of the gate cap hard mask 260. The directional RIE also removes some spacer material from the top spacer 525F. The vertical depositions (525S, 526S) form sides to define the volume where the gate material will be deposited later in the process.

The thickness of the top spacer 525F needs to be thick enough to cover the lowest elevation of doping in the fin after the anneal step in 900 but thin enough to allow adequate exposure 575 of the fin top 475 to enable epitaxial growth of the top S/D layer in the next process step 600. In an embodiment, the fin top 475 of the fin 135 should be exposed 575 between 2-10 nm, more preferably 2-6 nm. The thickness 525F of this low-k dielectric deposition is between 2-10 nm, more preferably 5-7 nm.

The SiGe fin caps 175 continue to protect the fins and are effectually unaffected by the directional RIE.

Incidentally, during the HDP deposition, the lower spacer 125 outside of the dummy gate increases to a larger thickness 525T and then it decreases during the directional RIE etch. This change in thickness of the exposed, exterior, lower spacer 525T occurs throughout the process. However, the thickness of the lower spacer around the bottom of the fins 125 remain unchanged and is thick enough to maintain the later formed gate from electrically shorting with the lower S/D.

FIG. 6A shows the protective SiGe fin caps 175 removed 600 from the PFET (elevation cross section view) structure 680. In this process step 600, there was no change to the NFET structure 590 shown in FIG. 6B because the gate cap hard mask 260 protects the fins 145 and the layers around them from this process.

Further, there is no change to the dummy gate 255 material in the PFET structure 680 because the gate cap hard mask 260 remains in place. Therefore, the dummy gate 255 is unaffected by the SiGe fin cap 175 removal.

The SiGe fin caps 175 can be removed by hot Standard Clean-1 (SC1). SC is standard cleaning process 600 used for wafer cleaning. Alternatively, the SiGe fin caps 175 can be removed by HCl gas. All these processes effectively remove the SiGe fin caps 175 and expose the top of the fin top (475, 575) so that the top S/D layer can be grown on the fin tops 475. The processes are used to remove the SiGe caps 175 have no effect on the gate cap hard mask 260. During the SiGe fin cap 175 removal, the subsequent growth of the top S/D region, and the anneal, the dummy gate region 255 remains protected by the gate cap hard mask 260.

In an embodiment, the optimal epitaxial growth on the exposed tips 575 of the fins 135 happens when there is both exposure on the top and sides of the fin tip. However, if the fin 135 tip exposure 575 is too long, the device will take up more vertical space because the top S/D region will be higher than it needs to be. As stated above, the top of the fin 135 is exposed 575 between 2-10 nm, more preferably 2-6 nm.

FIG. 7A is an elevation of the PFET structure 780 during an epitaxial growth of a top S/D region 730. No change occurs to the NFET structure 590 shown in FIG. 7B during this process step 700.

The epitaxial growth of the top S/D region 730 starts from the exposed 575 top of the fins 135. There is doping included during the epitaxial growth. Group III semiconductor materials can be used for the PFET structure 780 top S/D region 730 doping at various doping concentrations. A doping agent suitable for a PFET structure 780 is chosen from a group of boron (B), gallium (Ga), indium (In), and thallium (Tl). In one embodiment, boron doped SiGe (SiGe:B) is used to grow the top S/D region 730. The doping levels may be in a range from $1 \times 10^{18}$ cm$^{-3}$ to $5 \times 10^{21}$ cm$^{-3}$, or preferably between $2 \times 10^{20}$ cm$^{-3}$ to $1 \times 10^{21}$ cm$^{-3}$. In an embodiment, the doping level is about between $8 \times 10^{20}$ cm$^{-3}$ to $1.2 \times 10^{21}$ cm$^{-3}$. Non-limiting examples of doping methods include: in-situ doping, ion implantation, gas phase doping, plasma doping, and plasma immersion ion implantation, etc.

Silicon can also be used to grow the top S/D region 730.

During the initial epitaxial grown, geometric shapes, e.g. diamond shapes, form on the exposed 575 tops of the fins 135. In other embodiments, the epitaxial growth continues until a full layer is formed.

This epitaxial growth process 700 of the top S/D region 730 occurs between 600 to 700 degrees C. Growth at these temperatures causes quicker epitaxial growth and creates a uniformly doped top S/D region 730.

FIG. 8B shows an elevation cross section view after a series of steps creating a top S/D region 830 in an NFET structure 890 after the steps of a process 800 are performed. Both the NFET and PFET (FIG. 8A) structures are provided with a protective cap layer as part of process 800.

Process 800 is similar to that performed in processes 600 and 700, including: masking the PFET structure 880; exposing material for removal from the NFET structure 890; etching away part of the gate cap hard mask 260, part of the dummy gate material 255; removing the protective SiGe fin caps 175; exposing between 4 to 10 nm of the upper part of the NFET fins 145; non-conformally depositing the low-k dielectric material, e.g. with HDP; performing a direction RIE; and growing the top S/D region 830.

There is doping included during the epitaxial growth. A doping agent suitable for a NFET structure 890 is chosen. In one embodiment, silicon-carbon is doped with phosphorous, Si:C(P). In this embodiment, the epitaxial dopant is phosphorous (P) where carbon is used to slow P diffusion. For the NFET structure 890, arsenic (As) and antimony (Sb) can also be used as dopants. A dopant concentration range may be $1 \times 10^{18}$ cm$^{-3}$ to $5 \times 10^{21}$ cm$^{-3}$, or preferably between $2 \times 10^{20}$ cm$^{-3}$ to $1 \times 10^{21}$ cm$^{-3}$.

The doping can be formed by different processes, including, but not limited to: in-situ doping, ion implantation, gas phase doping, plasma doping, and plasma immersion ion implantation, etc.

The epitaxial growth of the top S/D layer 830 occurs at temperatures of around 600 to 700 degrees C. Growth at these temperatures causes quicker epitaxial growth of a uniform top S/D region 830.

It is noted that in this invention, both the top and bottom S/D regions of the NFET structure 890 still are formed before the gate structure is. Since these process steps before the gate structure is formed (and the gate cap hard mask 260 remains in place), higher thermal budgets are possible.

After the top S/D layer 830 is formed in the NFET structure 890, the mask protecting the PFET structure 880 is removed and both structures (880, 890) are exposed to low k dielectric deposition 825U to electrically insulate the top S/D regions. The materials for this deposition 800 can be selected from the same materials that can be used in the spacer layer 125. One embodiment is SiN.

FIG. 9A shows the PFET structure in elevation cross section view and FIG. 9B shows the NFET structure in elevation cross section view after both structures are processed in step 900. Step 900 includes the steps of annealing, dielectric deposition, and chemical mechanical polishing (CMP).

The process 900 begins with a high temperature anneal used to diffuse dopants simultaneously from the top S/D layers (730, 830) into the fin tops and from the bottom epitaxial layers (130, 140) into the fin bottoms for junction formation. The anneal may also be referred to herein as a junction anneal. The anneal can be performed at a temperature from 900° C. to 1200° C. in an inert ambient environment (i.e., helium, argon, neon and/or nitrogen). The anneal can be a furnace anneal, a laser anneal, or a spike anneal. At these temperatures the dopants diffuse from top and bottom S/D regions uniformly diffuse. Further, since the diffusion happens with the same dopants, materials, temperature, and time, the diffusion length, (e.g. top distance and bottom distance, respectively), at the fin tops (935 for PFET and 945 for NFET) and fin bottoms (930 for PFET and 940 for NFET) is the same, between 4 nm and 10 nm. As a result, the S/D regions of both the PFET 980 and NFET 990 are symmetrical, e.g. the top and bottom junctions are the same distance from the top and bottom S/D layers (730, 830) or top and bottom of the fins, respectively, and the performance of the VTFETs is enhanced.

The S/D junctions (typically 930, 935, 940, 945) form as the dopant in the top S/D layers (730, 830) and the bottom epitaxial layers (130, 140) diffuse into the upper portion and lower portion of the fin, respectively. The junction formation is self-aligning (e.g., junction distance from the respective S/D layers is the same) and the length of the dopant diffusion is controlled by varying the annealing temperature and time. The doped side of the S/D junctions at the fin tops (935, 945) take on the electrical characteristics of the top S/D layers (730, 830, respectively) and the doped side of the S/D junctions at the fin bottoms (930, 940) take on the electrical characteristics of the bottom epitaxial layers (130, 140, respectively.)

In the next step of process 900, a dielectric (exterior dielectric) 950 is deposited on both FET structures (980, 990.) The deposited dielectric covers the exposed, external spacer material, the horizontal spacer material 825. The vertical sides are also covered (825S, 826S.) The dielectric 950 also fills the opening in each of the FET structures (980, 990) and fills the volumes around and over the top S/D regions (730, 830.)

In an embodiment, the dielectric 950 is an oxide (flowable oxide, spin-on-glass, etc.), preferably silicon dioxide, SiO2.

The dielectric 950 can be deposited by various deposition techniques including, but not limited to, Chemical Vapor Deposition (CVD), Plasma Enhanced Chemical Vapor Deposition (PECVD), Radio Frequency Chemical Vapor Deposition (RFCVD,) Physical Vapor Deposition (PVD), Atomic Layer Deposition (ALD), Pulsed Laser Deposition (PLD), Liquid Source Misted Chemical Deposition (LSMCD), and/or sputtering.

In an embodiment, the FET structures (980, 990) are planarized by chemical-mechanical polishing (CMP).

Figures 10A, 10B:
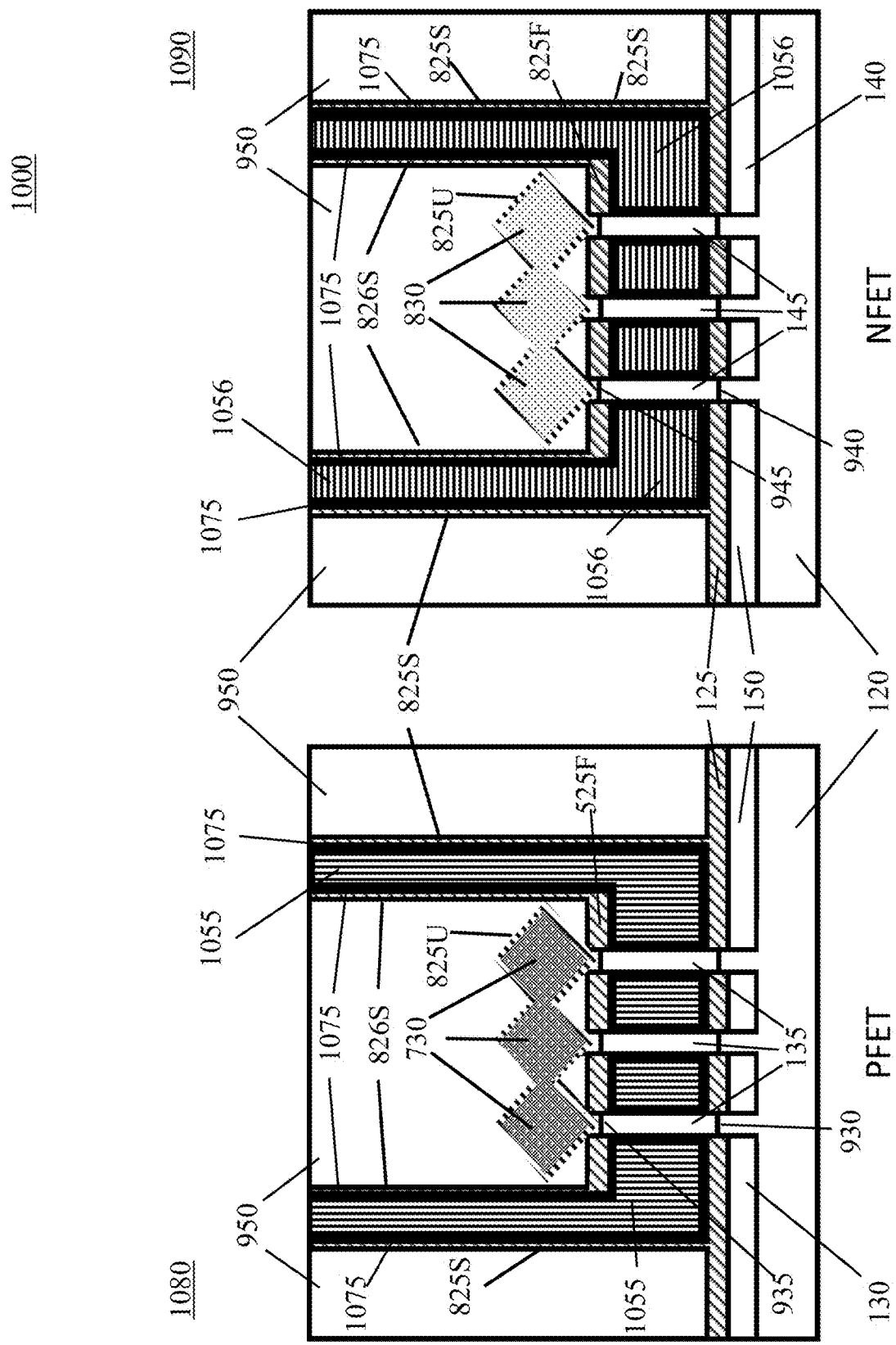
FIG. 10A is an elevation cross section view of the PFET structure after a replacement metal gate (RMG) process.
FIG. 10B is an elevation cross section view of the NFET structure after a replacement metal gate (RMG) process.

FIG. 10A is an elevation cross section view of the PFET and FIG. 10B is an elevation cross section view of the NFET structures after a replacement metal gate (RMG) process 1000.

Process 1000 begins with the steps of removing the gate cap hard mask 260 covering the dummy gate material 255. The hard mask 260 is removed between the dielectric sides (825S, 826S) without removing the dielectric sides (825S, 826S). This can be done by masking or choice of materials and etching chemistries.

After the gate cap hard mask 260 is removed, the dummy gate material 255 is removed. In one embodiment, the dummy gate material is amorphous silicon 255, α-Si, which is remove by exposure to NH4OH, i.e., aqueous ammonia, or ammonia hydroxide. The dielectric sides (825S, 826S) material SiO2 are unaffected by this exposure.

If the remaining liner layer 160 has not been removed with the dummy gate material 255, the remainder of the liner layer 160 is removed by well know methods.

After the dummy gate material 255 is removed, a void exists between the dielectric sides (825S, 826S) and the undoped channel regions of the fins (135, 145).

Before this void is filled with gate material/metal, a thin layer of high k dielectric material 1075 is applied to the surface of this void in both device structures (1080, 1090). This dielectric forms on and around the entire undoped fin (135, 145) surfaces, i.e. the channel regions, and forms the gate dielectric of the PFET 1080 and NFET 1090 structures.

In embodiments, the high k dielectric material 1075 is deposited by Atomic Layer Deposition (ALD) and is deposited at a thickness of about 2 nm. The deposition of the high k dielectric material 1075 is conformal to the surfaces of the void. Alternative deposition techniques include but are not limited to: chemical vapor deposition (CVD), plasma enhanced CVD (PECVD), radio frequency CVD (RFCVD), physical vapor deposition (PVD), pulsed laser deposition (PLD), liquid source misted chemical deposition (LSMCD), and/or sputtering.

In an embodiment, the high k dielectric material 1075 is HfO2. Other embodiments for the high k dielectric material 1075 include but are not limited to: hafnium oxide (HfO2), zirconium dioxide (ZrO2), hafnium zirconium oxide, aluminum oxide (Al2O3), and tantalum pentoxide (Ta2O5).

After the high k dielectric material 1075 is deposited, a work function metal can be deposited to fill the remainder of the void within the high k dielectric material 1075. Upon device completion, the high k dielectric material 1075 (around and on the channel region of the fins (135, 145)) will comprise the gate dielectric and the work function material will comprise the metal gate (also called gate area or gate region).

While the high k dielectric material 1075 can be the same for both the PFET 1080 and NFET 1090 structures, the work function material 1055 for the PFET structure 1080 will be different than the work function material 1056 for the NFET structure 1090.

The p-type work function metal layers 1055 include but are not necessarily limited to: titanium nitride (TiN), tantalum nitride (TaN) or ruthenium (Ru). These work function metals 1055 are deposited using, for example, deposition techniques including, but not limited to, Chemical Vapor Deposition (CVD), Plasma Enhanced CVD (PECVD), RFCVD, PVD, Atomic Layer Deposition (ALD), PLD, LSMCD, and/or sputtering Chemical Vapor Deposition (CVD), Plasma Enhanced Chemical Vapor Deposition (PECVD), Radio Frequency Chemical Vapor Deposition (RFCVD,) Physical Vapor Deposition (PVD), Atomic Layer Deposition (ALD), Pulsed Laser Deposition (PLD), Liquid Source Misted Chemical Deposition (LSMCD), and/or sputtering. In an embodiment, the work function metal 1055 is deposited by an ALD process.

The n-type work function metal 1056 include, but are not necessarily limited to, TiN, titanium aluminum nitride (TiAlN), titanium aluminum carbon nitride (TiAlCN), titanium carbide (TiC), titanium aluminum carbide (TiAlC), tantalum aluminum carbide (TaAlC), tantalum aluminum carbon nitride (TaAlCN) or lanthanum (La) doped TiN, TaN. These work function metal materials 1056 deposited using, for example, deposition techniques including, but not limited to, CVD, PECVD, RFCVD, PVD, Atomic Layer Deposition (ALD), PLD, LSMCD, and/or sputtering Chemical Vapor Deposition (CVD), Plasma Enhanced Chemical Vapor Deposition (PECVD), Radio Frequency Chemical Vapor Deposition (RFCVD,) Physical Vapor Deposition (PVD), Atomic Layer Deposition (ALD), Pulsed Laser Deposition (PLD), Liquid Source Misted Chemical Deposition (LSMCD), and/or sputtering.

In an embodiment, the work function metal 1056 is deposited by an ALD process.

There are different methods for depositing work function metal (1055, 1056) in the gate regions of the PFET 1080 and NFET 1090 structures, respectively.

In one embodiment, a mask is deposited on one of the FET structures (1080, 1090), covering the masked structure so no work function metal is deposited within the masked structure, but a first work function metal is deposited in the unmasked first structure. The masked structure is then unmasked and the previous unmasked structure is masked and second work function metal is applied to the second structure.

As an alternative embodiment, before removing the dummy gate material 255, the PFET 980 is masked and the NFET 990 is unmasked. In the NFET 990, the dummy gate material 255 is removed and the gate dielectric layer 1075 and the work function metal 1056 for the NFET 990 are deposited in sequence while the PFET structure undergoes no change. Then the NFET 990 is masked and the PFET 980 is unmasked. In the PFET 980, the dummy gate material 255 is removed and the gate dielectric layer 1075 and work function metal 1055 for the PFET 980 is deposited in sequence while the NFET structure 1090 is unaffected. The mask on the NFET is removed and the process 1000 terminates.

In another alternative embodiment of process 1000, the dummy gate material 255 is removed from both the PFET 980 and NFET 990 structures in the same step, e.g. during the etch of the dummy gate material 255, neither structure (980, 990) is masked. Further, the dielectric layer 1075 is deposited on the surfaces of the void created in each structure in the same step. The first work function metal for one of the structures (as a non-limiting example, the PFET 1080) is deposited as the work function metal 1055 in both structures (1080, 1090.) Then the first structure (here PFET 1080) is masked. The first work function metal 1055 is removed from the unmasked second structure (here NFET 1090), and the appropriate second work function metal (here 1056) is deposited in the second structure (here NFET 1090) while the first structure is unaffected because it is protected by the mask. The mask is removed and the process 1000 terminates. In an embodiment, the inappropriate work function metal is removed from the second structure by a known CMP or wet etch processes.

FIG. 11A is an elevation cross section view of the PFET and FIG. 1/B is an elevation cross section view of the NFET structures showing some of the metal gate being replaced with dielectric material 1125 to chemically and electrically isolate the remainder of the gate metal from the top of the device and electrically insulating the top S/D layer from the work function metal of the gate (1055, 1056) and metal gate region (1055G, 1056G).

Process 1100 begins by a CMP of both (1180, 1190) structures to remove any excess work function metal (1055, 1056) and to make the tops of the structures (1180, 1190) co-planar.

After the work function metal (1055, 1056) in both (1180, 1190) structures is etched to remove the work function metal (1055, 1056) and the gate dielectric layer 1075 down to the top of the top S/D layer (730, 830), there is a deposition of low-k material (525S, 526S) into the vertical openings until the openings are filled from the top S/D region (730, 830) to the top of the opening. The result is a top sub-volume, formally filled with some of the work function metal (1055, 1056), that is now filled with an electrically insulating dielectric forming a gate cap layer 1125 which prevents any connection to the recessed work function metal (i.e. the metal gates—1055, 1056) from the top of the structures (1180, 1190.) The gate cap layers 1125 also prevent shorts between a top S/D contact(s) (730, 830) and the respective gate regions (1055, 1056).

The gate cap layers 1125 are made from electrically insulating material including, but not limited to: silicon nitride (SiN), silicon boron nitride (SiBN), siliconborocarbonitride (SiBCN), or silicon oxycarbonitride (SiOCN). In embodiments, the gate cap layers 1125 are deposited using, for example, deposition techniques including, but not limited to, CVD, PECVD, RFCVD, PVD, Atomic Layer Deposition (ALD), PLD, LSMCD, and/or sputtering. Chemical Vapor Deposition (CVD), Plasma Enhanced Chemical Vapor Deposition (PECVD), Radio Frequency Chemical Vapor Deposition (RFCVD,) Physical Vapor Depostion (PVD), Atomic Layer Deposition (ALD), Pulsed Laser Deposition (PLD), Liquid Source Misted Chemical Deposition (LSMCD), and/or sputtering. In embodiments, the deposition is followed by a planarization process, such as, for example, CMP.

In accordance with one embodiment of the present invention, the gate cap layers 1125, gate dielectric 1075, bottom spacer 125, and top spacers (525F, 825F) are made of the same material, such as, for example, SiN, SiBN, or SiOCN.

The result is a U-shaped gate volume (1270, 1275) with gate dielectric 1075 surrounding the fins and all sides of the gate volume (1270, 1275) except for the bottom of gate cap layers 1125. For example, the entire underside of the top spacers (525F, 825F) is covered by di-electric 1075.

FIG. 12A is an elevation cross section view of the completed PFET 1280 and FIG. 12B is an elevation cross section view of the completed NFET 1290. This step 1200 of the method of making removes material from the structure (1280, 1290) to allow deposition of electrical contacts to the top 1250 and bottom 1210 S/D regions. The plan view, FIG. 12C, shows a novel double electrical connection 1210 to the bottom S/D layer, the top view of an electrical connection 1260 to the metal gate conductor, and a larger area top access connection 1250 to the top S/D layer (730, 830). The figures are not to scale. Also shown is novel insulating layers 1125 that electrically insulate the gate work function metal of the gate from the top S/D layer (730, 830).

Process 1200 begins by using a mask etching process to remove material, e.g. (exterior) dielectric 950, above the top S/D region (730, 830) and to etch holes through the dielectric 950 and bottom spacer 125 on the sides of the PFET 1280 and NFET 1290 structures to gain physical and electrical contact to the top of the bottom epitaxial layer 150 that is connected to the bottom S/D regions (130, 140) and the respective fins (135, 145.) There are 2 holes etched to contact the bottom epitaxial layer 150. This novel feature allows a larger surface area connection to the bottom S/D region and therefore reduces resistance in this connection.

A hole is also etched through the dielectric 950 on the STI side of the FETs down past the spacer layer 125 to create an opening for a contact to the gate metal (1055, 1056) in the gate regions (1055G, 1056G).

The process 1200 now fills the holes and area above the top S/D region with conductive material which acts to provide electrical and mechanical contact to the top S/D region (730, 830), bottom S/D region (130, 135, 140, 145), and the gate metal (1055, 1056).

Conductive materials used for these contacts include but are not limited to: a metal (e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au), etc.), a conducting metallic compound material (e.g., tantalum nitride (TaN), titanium nitride (TiN), tantalum carbide (TaCX), titanium carbide (TiC), titanium aluminum carbide, tungsten silicide (WSi2), tungsten nitride (WN), ruthenium oxide (RuO2), cobalt silicide, nickel silicide, etc.), or any suitable combination of these and other suitable materials. The conductive material may further comprise dopants that are incorporated during or after deposition. In some embodiments, the conductive material includes a work function metal (WFM) layer to set the threshold voltage of the VTFET to a desired value. The WFM may be: a nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a carbide, including but not limited to titanium carbide (TiC) titanium aluminum carbide (TiAlC), tantalum carbide (TaC), hafnium carbide (HfC); and combinations thereof.

The conductive material can be deposited by processes such as CVD, plasma enhanced chemical vapor deposition (PECVD), Atomic Layer Deposition (ALD), evaporation, PVD, chemical solution deposition, or other like processes. The thickness of the conductive material can vary depending on the deposition process as well as the composition and number of gate dielectric materials used.

Figure 13:
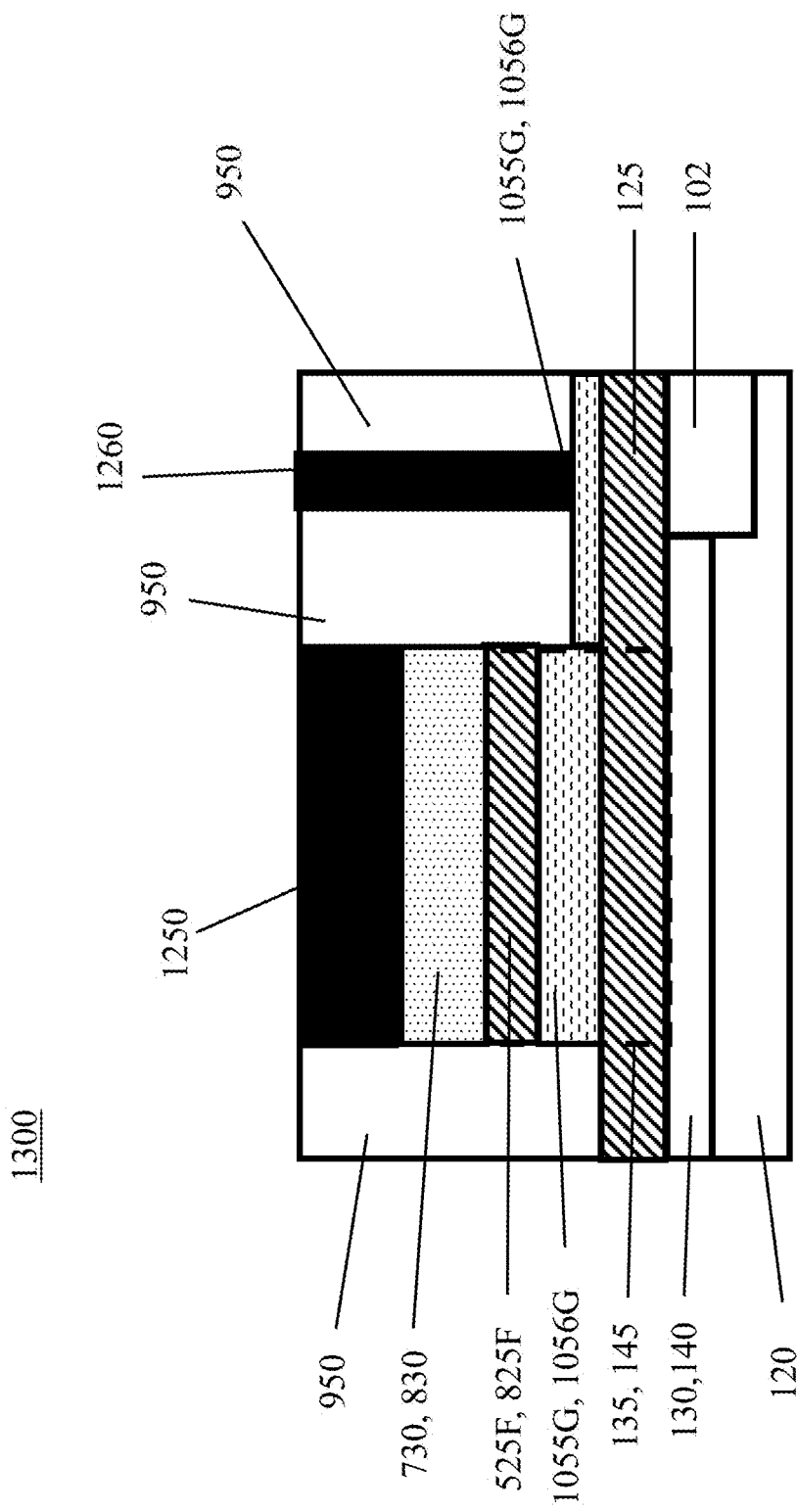
FIG. 13 is a side view elevation of VTFET structure showing feature elevations and connections.

FIG. 13 is a side view elevation of VTFET structure showing feature elevations and connections from elevation cross section view A-A shown in FIG. 12C. The structure 1300 shows the substrate 120, the STI region 102 recessed into the substrate 120 but with a top surface coplanar with the top of the epitaxial layer 150. The fins (135, 145) with their bottom S/D regions are shown in phantom view. The top S/D layer (730, 830) is shown surrounding the top region of the fins with an external contact 1250. The top spacer layer (525F, 825F) is shown around the top of the fin (135, 145).

The respective gate regions/areas (1055G, 1056G) protrude over the STI region 102 where they are connected to the external gate contact 1260. The external gate contact 1260 passes through the dielectric 950 and connects with the gate region (1055G, 1056G) through the gate metal contacts (1055, 1056).

Although illustrative embodiments of the present invention have been described herein with reference to the accompanying drawings, it is to be understood that the invention is not limited to those precise embodiments, and that various other changes and modifications may be made by one skilled in the art without departing from the scope or spirit of the invention.

It is to be appreciated that the various materials, processing methods (e.g., etch types, deposition types, etc.) and dimensions provided in the discussion above are presented by way of example only. Various other suitable materials, processing methods, and dimensions may be used as desired.

Various structures described above may be implemented in integrated circuits. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher-level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

We claim:

1. A vertical transport field effect transistor (VTFET) comprising:
   a substrate layer;
   an epitaxial layer disposed on the substrate layer, the epitaxial layer being a bottom source/drain (S/D) layer around one or more semiconductor fins, each semiconductor fin having a fin bottom, a fin channel, and a fin top, the fin bottoms electrically and mechanically connected and perpendicular to the substrate layer, the fin bottom being doped a bottom doped distance to a bottom junction and the fin top being doped a top doped distance to a top junction and the channel being either undoped or minimally doped;
   a top S/D layer electrically and mechanically connected to the tops of each of the fins;
   a top spacer layer disposed below the S/D layer and around the top of the fins, the top spacer layer being an electrically insulating dielectric and having a top spacer thickness;
   a bottom spacer layer disposed on the epitaxial layer and around the bottom of the fins, the bottom spacer layer being an electrically insulating dielectric and having a bottom spacer thickness;
   a gate volume being between the bottom spacer layer and the top spacer layer, the gate volume having an inner surface covered with gate dielectric and a work function metal being in the gate volume surrounding the channels of the fins,
   wherein the top doped distance and the bottom doped distance are equal within 2 nm and wherein the top spacer layer surrounds the top doped distance and the top junction and the bottom spacer layer surrounds the bottom doped distance and the bottom junction so that the channels of the fins are the only part of the fins in contact with the gate dielectric.

2. A VTFET, as in claim 1, where the gate contact is over a Shallow Trench Isolation (STI) area disposed in the substrate.

3. A VTFET, as in claim 1, where the top and bottom spacers are made of one of the following materials: silicon nitride (SiN), silicon boron nitride (SiBN), siliconborocarbonitride (SiBCN), and silicon oxycarbonitride (SiOCN).

4. A VTFET, as in claim 1, where the top spacer thickness is between 2 and 10 nanometers and the bottom spacer thickness is between 2 and 10 nanometers.

5. A VTFET, as in claim 1, where the gate dielectric covers the top spacer layer in the gate volume.

6. A WITT, as in claim 1, where the gate volume is U-shaped.

7. A VTFET, as in claim 1, that is a PFET and the work function metal is one of the following materials: titanium nitride (TiN), tantalum nitride (TaN) or ruthenium (Ru).

8. A VTFET, as in claim 1, that is a NETT and the work function metal is one of the following materials: titanium nitride (TiN), titanium aluminum nitride (TiAlN), titanium aluminum carbon nitride (TiAlCN), titanium carbide (TiC) titanium aluminum carbide (TiAlC), tantalum aluminum carbide (TaAlC), tantalum aluminum carbon nitride (TaAlCN), lanthanum (La) doped TiN, and La doped tantalum nitride (TaN).

9. A VTFET, as in claim 1, that has two surface areas in the gate volume covered by a gate cap and not the gate dielectric, the gate caps electrically insulating the work function metal from a top electrical connection to the top S/D layer.

10. A VTFET, as in claim 1, where the gate dielectric and the work function metal entirety surround the fin channels.

11. A vertical transport field effect transistor (VTFET) comprising:
- a substrate layer;
- a plurality of fins being perpendicular to the substrate layer, each of the fins having a fin bottom and a fin top, each of the fin bottoms electrically and mechanically connected to the substrate layer;
- a. bottom source/drain (S/D) layer disposed on the substrate layer and electrically and mechanically connected to and surrounding the fin bottoms;
- a bottom S/D junction to which the fin bottom is doped with the same doping as the bottom SIT) layer is doped, the bottom S/D junction being a bottom doped distance from the bottom SID layer;
- a top S/D layer electrically and mechanically connected to and surrounding the fin tops;
- a top SID junction to which the fin top is doped with the same doping as the top S/D layer is doped, the top S/D junction being a top doped distance from the top S/D layer;
- a channel in each of the fins between the bottom S/D junction and top S/D junction;
- a top spacer layer disposed below the top S/D layer and around the top of the fins the top spacer layer being an electrically insulating dielectric and having a top spacer thickness;
- a bottom spacer layer disposed on the bottom S/D layer and around the bottom of the fins, the bottom spacer layer being an electrically insulating dielectric and having a bottom spacer thickness; and
- a gate volume having an inner surface gate dielectric surrounding the channel of each of the fins and a work function metal disposed on the inner surface gate dielectric,
- wherein the top doped distance and the bottom doped distance are equal within 2 nanometers and wherein the top spacer layer surrounds the top doped distance and the top S/D junction and the bottom spacer layer surrounds the bottom doped distance and the bottom S/D junction so that the channels of the fins are the only part of the fins in contact with the gate dielectric.

12. A VTFET, as in claim 11, further comprising where the channel is undoped or doped minimally.

13. A VTFET, as in claim 11, further comprising a bottom spacer layer disposed on the bottom S/D layer and surrounding the bottom S/D junction.

14. A VTFET, as in claim 11, further comprising a top spacer layer surrounding the top S/D junction.

15. A VTFET, as in claim 11, where the top S/D layer and the bottom S/D layer are doped with a p-type dopant.

16. A VTFET, as in claim 11, where the top S/D layer and the bottom S/D layer are doped with a n-type dopant.

17. A vertical transport field effect transistor (VTFET) circuit comprising:
- a substrate layer;
- a plurality of fins being perpendicular to the substrate layer, each of the fins having a fin bottom and a fin top, each of the fin bottoms electrically and mechanically connected to the substrate layer;
- a set of one or more PFETs comprising:
  - a PFET bottom source/drain (SID) layer disposed on the substrate layer and electrically and mechanically connected to and surrounding the fin bottoms;
  - a PFET bottom SID junction to which the fin bottom is doped as the PFET bottom S/D layer is doped with a p-type dopant, the PFET bottom S/D junction being a PFET bottom doped distance from the PFET bottom S/I) layer;
  - a PFET top S/D layer electrically and mechanically connected to and surrounding the fin tops;
  - a PFET top S/D junction to which the fin top is doped as the PFET top S/D layer is doped with a p-type dopant, the PFET top S/D junction being a PFET top doped distance from the PFET top S/D layer;
  - a PFET channel being between each of the PFET bottom S/D junction and PFET top S/D junction; and
  - a gate volume having an inner surface gate dielectric surrounding the channel of each of the fins and a PFET work function metal disposed on the inner surface gate dielectric,
- wherein the PFET top doped distance and the PFET bottom doped distance are equal within 2 nanometers; and
- a set of one or more NFETs comprising:
  - a NFET bottom source/drain (S/D) layer disposed on the substrate layer and electrically and mechanically connected to and surrounding the fin bottoms;
  - a NFET bottom S/D junction to which the fin bottom is doped as the NFET bottom S/D layer is doped with an n-type dopant, the NFET bottom S/D junction being a NFET bottom doped distance from the NFET bottom S/D layer;
  - a NFET top S/D layer electrically and mechanically connected to and surrounding the fin tops;
  - a NFET top S/D junction to which the fin top is doped as the NFET top S/D layer is doped with an n-type dopant, the NFET top S/D junction being a NFET top doped distance from the NFET top S/D layer;
  - a NFET channel being between each of the NFET bottom S/D junction and NFET top S/D junction;
- a top spacer layer disposed below the PFET top S/D layer and below the NFET top S/D layer and around the fin tops, the top spacer layer being an electrically insulating dielectric and having a top spacer thickness;
- a bottom spacer layer disposed on the bottom PFET bottom S/D layer and on the NFET bottom S/D layer and around the fin bottoms, the bottom spacer layer being an electrically insulating dielectric and having a bottom spacer thickness; and
- a gate volume having an inner surface gate dielectric surrounding the channel of each of the fins and a NFET work function metal disposed on the inner surface gate dielectric,
- wherein the NFET top doped distance, the NFET bottom doped distance, the PFET top doped distance, and the PFET bottom doped distance are equal within 2 nanometers and wherein the top spacer layer surrounds the NFET top doped distance, the NFET top S/D junction, the FEET top doped distance, and the PFET top S/D junction and the bottom spacer layer surrounds the NFET bottom doped distance, the NFET bottom S/D junction, the PFET bottom doped distance, and the PFET bottom S/D junction so that the channels of the fins are the only part of the fins in contact with the gate dielectric.

18. A VTFET circuit, as in claim 17, where p-type dopant is selected from a group of boron (B), gallium (Ga), indium (In), and thallium (Tl).

19. A VTFET circuit, as in claim 17, where n-type dopant is selected from a group of phosphorus (P), arsenic (As) and antimony (Sb).

\* \* \* \* \*